US012740392B2

(12) United States Patent
Watanabe

(10) Patent No.: US 12,740,392 B2
(45) Date of Patent: Sep. 15, 2026

(54) SEMICONDUCTOR DEVICE PREVENTING INSULATING LAYER PEELING AND METHOD OF MANUFACTURING SEMICONDUCTOR DEVICE

(71) Applicant: SUMITOMO ELECTRIC DEVICE INNOVATIONS, INC., Kanagawa (JP)

(72) Inventor: Kenichi Watanabe, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 359 days.

(21) Appl. No.: 18/542,965

(22) Filed: Dec. 18, 2023

(65) Prior Publication Data

US 2024/0213122 A1 Jun. 27, 2024

(30) Foreign Application Priority Data

Dec. 23, 2022 (JP) ................................ 2022-207148

(51) Int. Cl.
*H10W 20/40* (2026.01)
*H10P 50/26* (2026.01)
(Continued)

(52) U.S. Cl.
CPC ........... *H10W 20/40* (2026.01); *H10P 50/266* (2026.01); *H10P 50/667* (2026.01); *H10W 74/01* (2026.01); *H10W 74/147* (2026.01)

(58) Field of Classification Search
CPC .... H10P 50/266; H10P 50/667; H10W 20/01; H10W 20/063; H10W 20/0633; H10W 20/0636; H10W 20/40; H10W 20/41; H10W 20/425; H10W 20/484; H10W 70/652; H10W 70/6523; H10W 70/6525; H10W 70/6528; H10W 72/019; H10W 72/01904; H10W 72/01908; H10W 72/01921; H10W 72/01923;
(Continued)

(56) References Cited

U.S. PATENT DOCUMENTS

2010/0163929 A1 7/2010 Ohki
2010/0164112 A1 7/2010 Hishida et al.
(Continued)

FOREIGN PATENT DOCUMENTS

JP 2010-153707 7/2010
JP 2010-157617 7/2010
(Continued)

*Primary Examiner* — Cheung Lee
(74) *Attorney, Agent, or Firm* — IPUSA, PLLC

(57) ABSTRACT

A semiconductor device includes a substrate; a first insulating layer provided on the substrate; a first metal layer provided on the first insulating layer; a second metal layer provided on the first metal layer; and a second insulating layer covering the first metal layer and the second metal layer. An upper surface of the first metal layer has a first region that is in contact with the second metal layer, and a second region that is separated from the second metal layer. The second insulating layer is in direct contact with a side surface and the second region of the first metal layer and an upper surface and a side surface of the second metal layer. A width of the first metal layer is greater than or equal to a width of the second metal layer in a direction parallel to the substrate.

11 Claims, 22 Drawing Sheets

(51) Int. Cl.

| | |
|---|---|
| ***H10P 50/66*** | (2026.01) |
| ***H10W 74/01*** | (2026.01) |
| ***H10W 74/10*** | (2026.01) |

(58) Field of Classification Search

CPC ..... H10W 72/01925; H10W 72/01931; H10W 72/01933; H10W 72/01935; H10W 72/01936; H10W 72/01938; H10W 72/01951; H10W 72/01953; H10W 72/01955; H10W 72/01961; H10W 72/01971; H10W 74/01; H10W 74/147; H10W 99/00

See application file for complete search history.

(56) References Cited

U.S. PATENT DOCUMENTS

| | | | | |
|---|---|---|---|---|
| 2016/0225888 | A1 | 8/2016 | Kikuchi | |
| 2017/0365571 | A1 | 12/2017 | Matsuda | |
| 2017/0372955 | A1 | 12/2017 | Matsuura | |
| 2019/0131198 | A1* | 5/2019 | Ogumi | H10W 74/129 |
| 2020/0091098 | A1 | 3/2020 | Matsuda | |
| 2020/0279822 | A1 | 9/2020 | Matsuda | |

FOREIGN PATENT DOCUMENTS

| | | |
|---|---|---|
| JP | 2016-143723 | 8/2016 |
| JP | 2017-228583 | 12/2017 |
| JP | 2018-006398 | 1/2018 |
| JP | 2020-047775 | 3/2020 |
| JP | 2020-141054 | 9/2020 |

* cited by examiner 1
33
32
31
12
11
70D
71D
42D
26D
25D
24D
21D
22D
23D
31D
40D
41D
32D
60D
50D
WD2
WD1
21G
34
33G
70S
71S
42S
26S
25S
24S
21S
22S
23S
31S
40S
41S
32S
60S
50S
WS2
WS1
X
Y
Z

SEMICONDUCTOR DEVICE PREVENTING INSULATING LAYER PEELING AND METHOD OF MANUFACTURING SEMICONDUCTOR DEVICE

CROSS-REFERENCE TO RELATED APPLICATIONS

This application claims priority to Japanese Patent Application No. 2022-207148, filed on Dec. 23, 2022, the entire subject matter of which is incorporated herein by reference.

TECHNICAL FIELD

The present disclosure relates to a semiconductor device and a method of manufacturing the semiconductor device.

BACKGROUND

There is a semiconductor device in which an insulating layer is formed on a semiconductor layer, an adhesion layer is formed on the insulating layer, a seed layer is formed on the adhesion layer, and a plating layer is formed on the seed layer. A laminated structure of the adhesion layer, the seed layer, and the plating layer is covered with an insulating layer for surface protection.

[Patent Document 1] Japanese Patent Laid-Open Application Publication No. 2020-141054

SUMMARY

According to an embodiment of the present disclosure, a semiconductor device includes a substrate; a first insulating layer provided over the substrate; a first metal layer provided on the first insulating layer; a second metal layer provided on the first metal layer; and a second insulating layer covering the first metal layer and the second metal layer. An upper surface of the first metal layer has a first region that is in contact with the second metal layer, and a second region that is separated from the second metal layer. The second insulating layer is in direct contact with a side surface and the second region of the first metal layer and an upper surface and a side surface of the second metal layer. A width of the first metal layer is greater than or equal to a width of the second metal layer in a direction parallel to the substrate.

DETAILED DESCRIPTION

Figure 1:
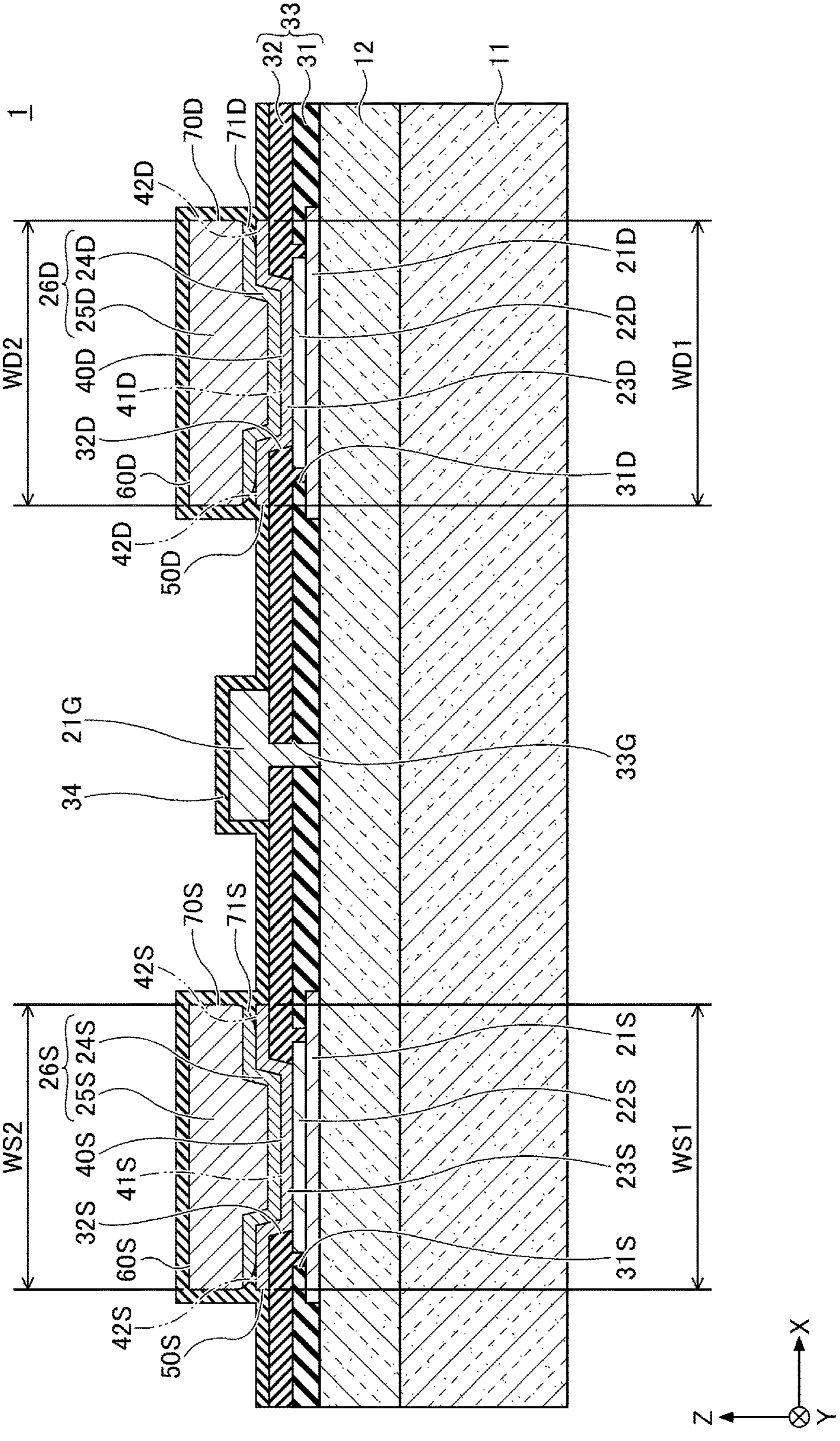
FIG. 1 is a cross-sectional view illustrating a semiconductor device according to a first embodiment.

Problem to Be Solved by the Present Disclosure

In a semiconductor device in the related art, an insulating layer for surface protection may peel from a laminated structure. The peeling of the insulating layer for surface protection may cause deterioration of electrical characteristics due to the entry of moisture or the like.

Effect of the Present Disclosure

According to the present disclosure, the peeling of the insulating layer can be prevented.

Description of Embodiments of the Present Disclosure

First, embodiments of the present disclosure will be listed and described.

[1] A semiconductor device according to an aspect of the present disclosure includes a substrate; a first insulating layer provided over the substrate; a first metal layer provided on the first insulating layer; a second metal layer provided on the first metal layer; and a second insulating layer covering the first metal layer and the second metal layer. An upper surface of the first metal layer has a first region that is in contact with the second metal layer, and a second region that is separated from the second metal layer. The second insulating layer is in direct contact with a side surface and the second region of the first metal layer and an upper surface and a side surface of the second metal layer. A width of the first metal layer is greater than or equal to a width of the second metal layer in a direction parallel to the substrate.

The upper surface of the first metal layer has the second region that is separated from the second metal layer, and the second insulating layer is also in direct contact with the second region. Thus, in comparison with a case where the second insulating layer is not in direct contact with the upper surface of the first metal layer, the contact area between the second insulating layer and the first metal layer is large, and good adhesion is obtained between the second insulating layer and a laminated structure of the first metal layer and the second metal layer. Therefore, the peeling of the second insulating layer from the laminated structure of the first metal layer and the second metal layer can be prevented.

[2] In [1], the adhesion between the second insulating layer and the first metal layer may be higher than the adhesion between the second insulating layer and the second metal layer. In this case, even when the adhesion between the second insulating layer and the second metal layer is low, good adhesion can be obtained between the second insulating layer and the laminated structure of the first metal layer and the second metal layer.

[3] In [1] or [2], the second metal layer may be a gold layer. In this case, a low electrical resistance is easily obtained in the second metal layer.

[4] In [3], the first metal layer may be a titanium layer, a titanium tungsten alloy layer, a tantalum layer, a chromium layer, a molybdenum layer, or a niobium layer. In this case, due to the first metal layer, good adhesion is easily obtained between the first insulating layer and the second metal layer.

[5] In any one of [1] to [4], the second insulating layer may be a silicon nitride layer. In this case, the first metal layer and the second metal layer are easily protected from the entry of moisture or the like.

[6] In any one of [1] to [5], the second region may have an enclosed shape and the average value of the widths of the second region may be 0.10 μm or greater in plan view in a direction perpendicular to the upper surface of the first metal layer. In this case, a sufficient contact area is easily obtained between the first metal layer and the second insulating layer.

[7] In any one of [1] to [6], the side surface of the second metal layer may have a curved surface, and the curved surface may be curved in a direction in which a center of an osculating circle is located inside the curved surface when viewed from the second metal layer. In this case, the second metal layer is easily separated from the second region.

[8] A method of manufacturing a semiconductor device according to another aspect of the present disclosure includes forming a first insulating layer on a substrate; forming a first metal layer on the first insulating layer; forming a seed layer on the first metal layer; forming a plating layer on the seed layer to obtain a second metal layer including the seed layer and the plating layer; etching the second metal layer such that an upper surface of the first metal layer has a first region that is in contact with the second metal layer and a second region that is separated from the second metal layer; and forming a second insulating layer that is in direct contact with a side surface and the second region of the first metal layer and an upper surface and a side surface of the second metal layer.

The second insulating layer is also in direct contact with the second region, so that the peeling of the second insulating layer from the laminated structure of the first metal layer and the second metal layer can be prevented.

[9] A method of manufacturing a semiconductor device according to still another aspect of the present disclosure includes forming a first insulating layer on a substrate; forming a third metal layer on the first insulating layer; forming a second metal layer on the third metal layer; forming an etching mask covering the second metal layer; forming a first metal layer from the third metal layer by etching the third metal layer exposed from the etching mask, an upper surface of the first metal layer having a first region that is in contact with the second metal layer and a second region that is separated from the second metal layer; removing the etching mask; and forming a second insulating layer that is in direct contact with a side surface and the second region of the first metal layer and an upper surface and a side surface of the second metal layer.

In this case, the second insulating layer is also in direct contact with the second region, so that the peeling of the second insulating layer from the laminated structure of the first metal layer and the second metal layer can be prevented.

[10] In [8], the etching of the second metal layer may be wet etching using an iodine-based etchant. In this case, a portion where an impurity is aggregated is removed from the plating layer by wet etching, so that the adhesion between the plating layer and the second insulating layer can be improved.

[11] In [8], in the forming of the seed layer, the width of the formed seed layer may be less than or equal to the width of the first metal layer in a direction parallel to the substrate. In this case, the peeling of the second insulating layer from the laminated structure of the first metal layer and the second metal layer can be prevented.

[12] In [9], in the forming of the first metal layer from the third metal layer, the width of the formed first metal layer may be greater than or equal to the width of the second metal layer in a direction parallel to the substrate. In this case, the peeling of the second insulating layer from the laminated structure of the first metal layer and the second metal layer can be prevented.

Details of Embodiments of the Present Disclosure

In the following, the embodiments of the present disclosure will be described in detail, but the present disclosure is not limited thereto. In the present specification and the drawings, components having substantially the same functional configurations are denoted by the same reference symbols, and duplicated description thereof may be omitted.

Additionally, in the following description, the XYZ orthogonal coordinate system is used. However, the coordinate system is defined for description and does not limit the posture of the semiconductor device. Additionally, when viewed from an arbitrary point, the +Z side may be referred to as above, an upper side, or up, and the −Z side may be referred to as below, a lower side, or down. In the present disclosure, "in plan view" indicates that an object is viewed from above, and "a planar shape" indicates a shape of an object viewed from above.

First Embodiment

Figure 2:
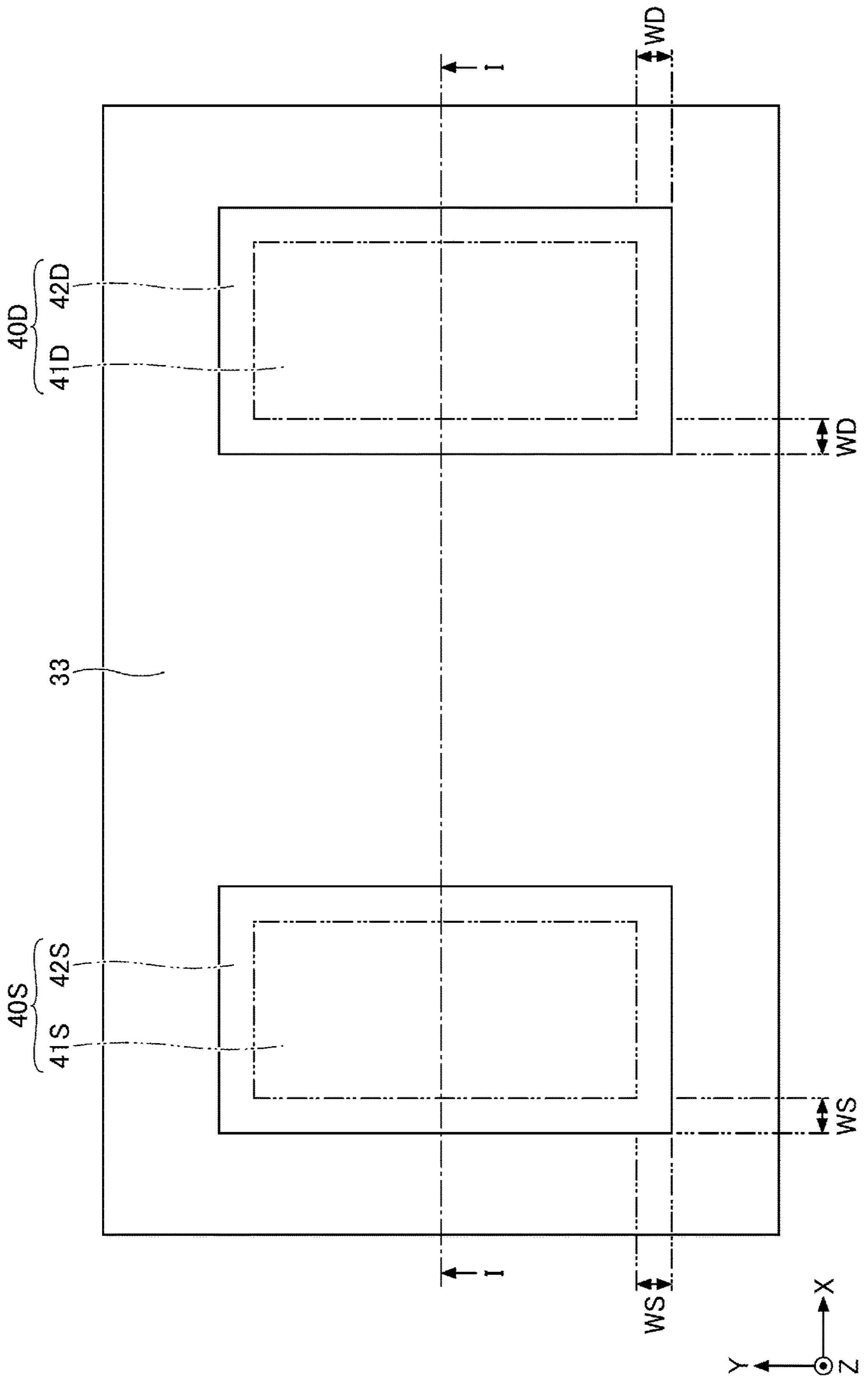
FIG. 2 is a top view illustrating a configuration of an upper surface of an adhesion layer in the first embodiment.

A first embodiment will be described. The first embodiment relates to a semiconductor device including a GaN-based high electron mobility transistor (HEMT). FIG. 1 is a cross-sectional view illustrating a semiconductor device according to the first embodiment. FIG. 2 is a top view illustrating a configuration of an upper surface of an adhesion layer in the first embodiment. FIG. 1 corresponds to a cross-sectional view taken along the line I-I in FIG. 2.

As illustrated in FIG. 1 and FIG. 2, a semiconductor device 1 according to the first embodiment mainly includes a substrate 11, a semiconductor layer 12, a gate electrode 21G, a source electrode 21S, and a drain electrode 21D. The semiconductor device 1 further includes barrier metal layers 22S and 22D, adhesion layers 23S and 23D, seed layers 24S and 24D, plating layers 25S and 25D, and insulating layers 31, 32, and 34.

The substrate 11 is, for example, a silicon carbide (SiC) substrate. The semiconductor layer 12 is provided on the substrate 11. The semiconductor layer 12 is, for example, a nitride semiconductor layer containing gallium (Ga). The nitride semiconductor layer forms a part of a high electron mobility transistor such as an electron transit layer (a channel layer) and an electron supply layer (barrier layer).

The source electrode 21S and the drain electrode 21D are provided on the semiconductor layer 12. The source electrode 21S and the drain electrode 21D extend parallel in the Y-axis direction. The source electrode 21S and the drain electrode 21D are in ohmic contact with the semiconductor layer 12. The source electrode 21S and the drain electrode 21D are, for example, aluminum (Al) electrodes.

The insulating layer 31 is provided on the semiconductor layer 12. The insulating layer 31 covers the source electrode 21S and the drain electrode 21D. In the insulating layer 31, an opening 31S where a portion of the source electrode 21S is exposed and an opening 31D where a portion of the drain electrode 21D is exposed are formed. The openings 31S and 31D extend parallel in the Y-axis direction. The insulating layer 31 is, for example, a silicon nitride (SiN) layer.

The barrier metal layer 22S is provided on the source electrode 21S inside the opening 31S. The barrier metal layer 22D is provided on the drain electrode 21D inside the opening 31D. The barrier metal layers 22S and 22D extend parallel in the Y-axis direction. The barrier metal layers 22S and 22D are, for example, titanium tungsten (TiW) alloy layers.

The insulating layer 32 is provided on the insulating layer 31. The insulating layer 32 covers the barrier metal layers 22S and 22D. In the insulating layer 32, an opening 32S where a portion of the barrier metal layer 22S is exposed and an opening 32D where a portion of the barrier metal layer 22D is exposed are formed. The openings 32S and 32D extend parallel in the Y-axis direction. The insulating layer 32 is, for example, a silicon nitride (SiN) layer. The insulating layers 31 and 32 are included in an interlayer insulating film 33. The insulating layer 32 is an example of a first insulating layer.

The adhesion layer 23S is formed on the insulating layer 32 so as to be in contact with the barrier metal layer 22S through the opening 32S. The adhesion layer 23S is in direct contact with an upper surface of the barrier metal layer 22S inside the opening 32S. Further, the adhesion layer 23S is in direct contact with inner surfaces of the opening 32S and an upper surface of the insulating layer 32. The adhesion layer 23D is formed on the insulating layer 32 so as to be in contact with the barrier metal layer 22D through the opening 32D. The adhesion layer 23D is in direct contact with an upper surface of the barrier metal layer 22D inside the opening 32D. Further, the adhesion layer 23D is in direct contact with inner surfaces of the opening 32D and the upper surface of the insulating layer 32. The adhesion layers 23S and 23D extend parallel in the Y-axis direction. The adhesion layers 23S and 23D are, for example, titanium (Ti) layers. The adhesion layers 23S and 23D may be titanium tungsten (TiW) alloy layers, tantalum (Ta) layers, chromium (Cr) layers, molybdenum (Mo) layers, or niobium (Nb) layers. The adhesion layers 23S and 23D are examples of a first metal layer.

The seed layer 24S is provided on the adhesion layer 23S. The seed layer 24D is provided on the adhesion layer 23D. The seed layers 24S and 24D are, for example, gold (Au) layers. The thickness of the seed layers 24S and 24D are, for example, about 100 nm.

The plating layer 25S is provided on the seed layer 24S. The plating layer 25D is provided on the seed layer 24D. The plating layers 25S and 25D are, for example, gold (Au) layers. The thickness of the plating layers 25S and 25D are, for example, about 4 μm. The seed layer 24S and the plating layer 25S are included in a metal laminate 26S. The seed layer 24D and the plating layer 25D are included in a metal laminate 26D. For example, the adhesion between the insulating layer 34 and the adhesion layer 23S is higher than the adhesion between the insulating layer 34 and the metal laminate 26S, and the adhesion between the insulating layer 34 and the adhesion layer 23D is higher than the adhesion between the insulating layer 34 and the metal laminate 26D. In a direction parallel to the substrate 11, the width WS1 of the adhesion layer 23S is equal to the width WS2 of the metal laminate 26S, and the width WD1 of the adhesion layer 23D is equal to the width WD2 of the metal laminate 26D. The metal laminates 26S and 26D are examples of a second metal layer.

As illustrated in FIG. 2, an upper surface 40S of the adhesion layer 23S has a first region 41S and a second region 42S, and an upper surface 40D of the adhesion layer 23D has a first region 41D and a second region 42D. In plan view, the second region 42S has an enclosed shape, and the second region 42S surrounds the first region 41S. The average value of the widths WS of the second region 42S is, for example, 0.10 μm or greater. In plan view, the second region 42D has an enclosed shape, and the second region 42D surrounds the first region 41D. The average value of the widths WD of the second region 42D is, for example, 0.10 μm or greater.

The metal laminate 26S is in contact with the first region 41S of the upper surface 40S of the adhesion layer 23S and is separated from the second region 42S. From another viewpoint, the first region 41S is in contact with the metal laminate 26S, and the second region 42S is separated from the metal laminate 26S. The metal laminate 26D is in contact with the first region 41D of the upper surface 40D of the adhesion layer 23D and is separated from the second region 42D. From another viewpoint, the first region 41D is in contact with the metal laminate 26D, and the second region 42D is separated from the metal laminate 26D.

A side surface 70S of the metal laminate 26S has, for example, a curved surface 71S. The curved surface 71S is curved in a direction where a center of an osculating circle is located inside the curved surface 71S when viewed from the metal laminate 26S. A lower end of the curved surface 71S is in contact with the upper surface 40S of the adhesion layer 23S. A portion of the upper surface 40S that is in contact with the lower end of the curved surface 71S matches the boundary between the first region 41S and the second region 42S. A side surface 70D of the metal laminate 26D has, for example, a curved surface 71D. The curved surface 71D is curved in a direction where a center of an osculating circle is located inside the curved surface 71D when viewed from the metal laminate 26D. A lower end of the curved surface 71D is in contact with the upper surface 40D of the adhesion layer 23D. A portion of the upper surface 40D that is in contact with the lower end of the curved surface 71D matches the boundary between the first region 41D and the second region 42D.

An opening 33G is formed in the interlayer insulating film 33. The opening 33G extends in the Y-axis direction. The opening 33G is located between the source electrode 21S and the drain electrode 21D in plan view. The gate electrode 21G is provided on the interlayer insulating film 33 and is in Schottky contact with the semiconductor layer 12 through the opening 33G. The gate electrode 21G extend in the Y-axis direction. The gate electrode 21G includes, for example, a nickel (Ni) layer, a palladium (Pd) layer, and a gold (Au) layer stacked in this order upward.

The insulating layer 34 is provided on the insulating layer 32. The insulating layer 34 covers the metal laminate 26S, the adhesion layer 23S, the metal laminate 26D, the adhesion layer 23D, and the gate electrode 21G. The insulating layer 34 is in direct contact with a side surface 50S and the second region 42S of the adhesion layer 23S and an upper surface 60S and a side surface 70S of the metal laminate 26S. The insulating layer 34 is in direct contact with a side surface 50D of the adhesion layer 23D, the second region 42D, and an upper surface 60D and a side surface 70D of the metal laminate 26D. The insulating layer 34 is, for example, a silicon nitride (SiN) layer. The insulating layer 34 is an example of a second insulating layer.

Next, a method of manufacturing the semiconductor device 1 according to the first embodiment will be described. FIG. 3 to FIG. 14 are cross-sectional views illustrating the method of manufacturing the semiconductor device 1 according to the first embodiment.

Figure 3:
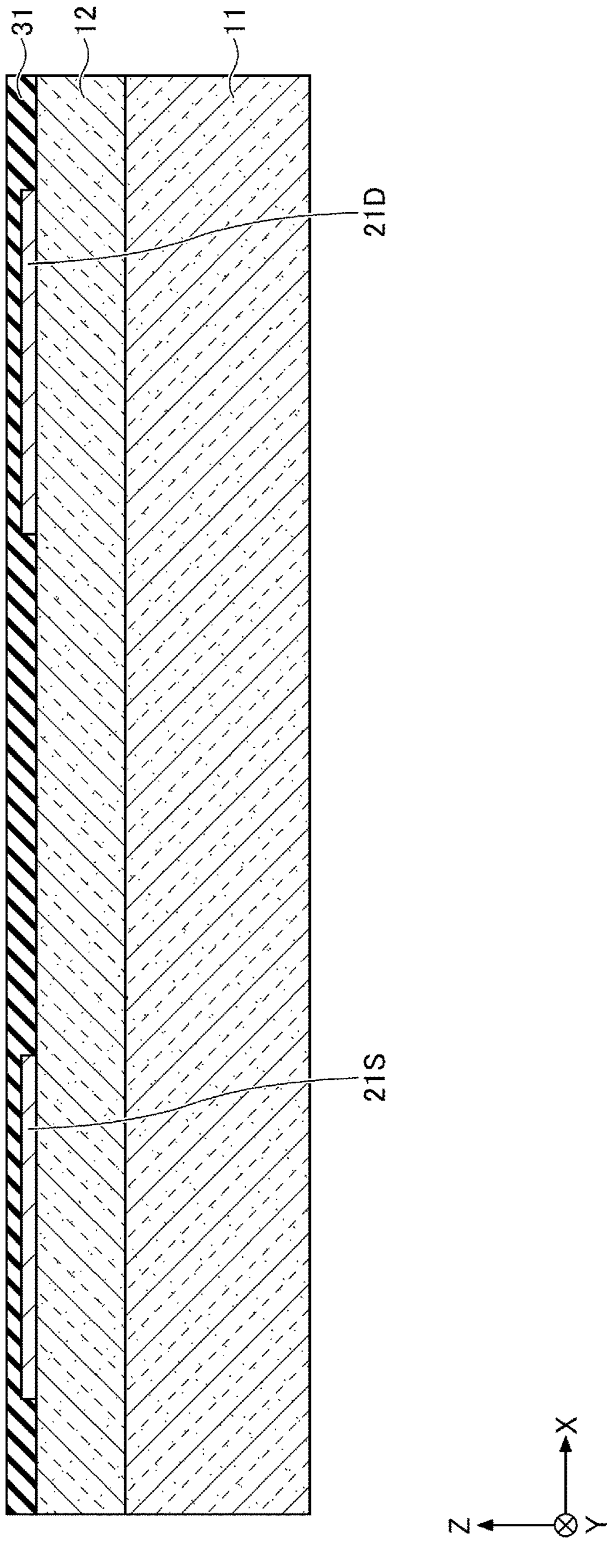
FIG. 3 is a cross-sectional view (1) illustrating a method of manufacturing the semiconductor device according to the first embodiment.

First, as illustrated in FIG. 3, the semiconductor layer 12 is formed on the substrate 11 by, for example, a metal organic chemical vapor deposition (MOCVD) method. Next, the source electrode 21S and the drain electrode 21D are formed on the semiconductor layer 12. In the formation of the source electrode 21S and the drain electrode 21D, a metal layer, for example, an Al layer, is grown by a vapor deposition method using a growing mask, and subsequently the growing mask is removed. That is, the source electrode 21S and the drain electrode 21D can be formed by, for example, vapor deposition and lift-off. Next, the insulating layer 31 covering the source electrode 21S and the drain electrode 21D is formed on the semiconductor layer 12. The insulating layer 31 can be formed by, for example, a plasma CVD method.

Figure 4:
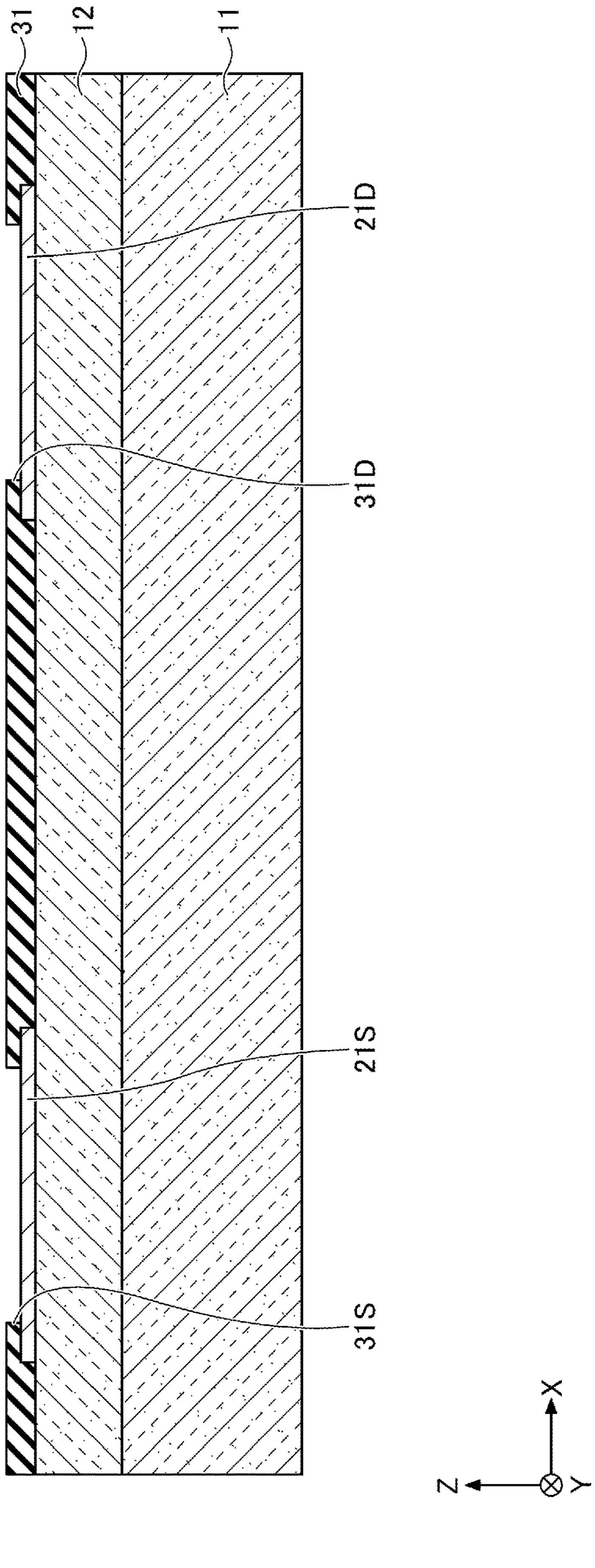
FIG. 4 is a cross-sectional view (2) illustrating the method of manufacturing the semiconductor device according to the first embodiment.

Next, as illustrated in FIG. 4, the openings 31S and 31D are formed in the insulating layer 31. In the formation of the openings 31S and 31D, for example, reactive ion etching (RIE) using a resist pattern as a mask is performed. For example, a reactive gas containing fluorine (F) is used for etching the insulating layer 31. The resist pattern is removed after the etching of the insulating layer 31.

Figure 5:
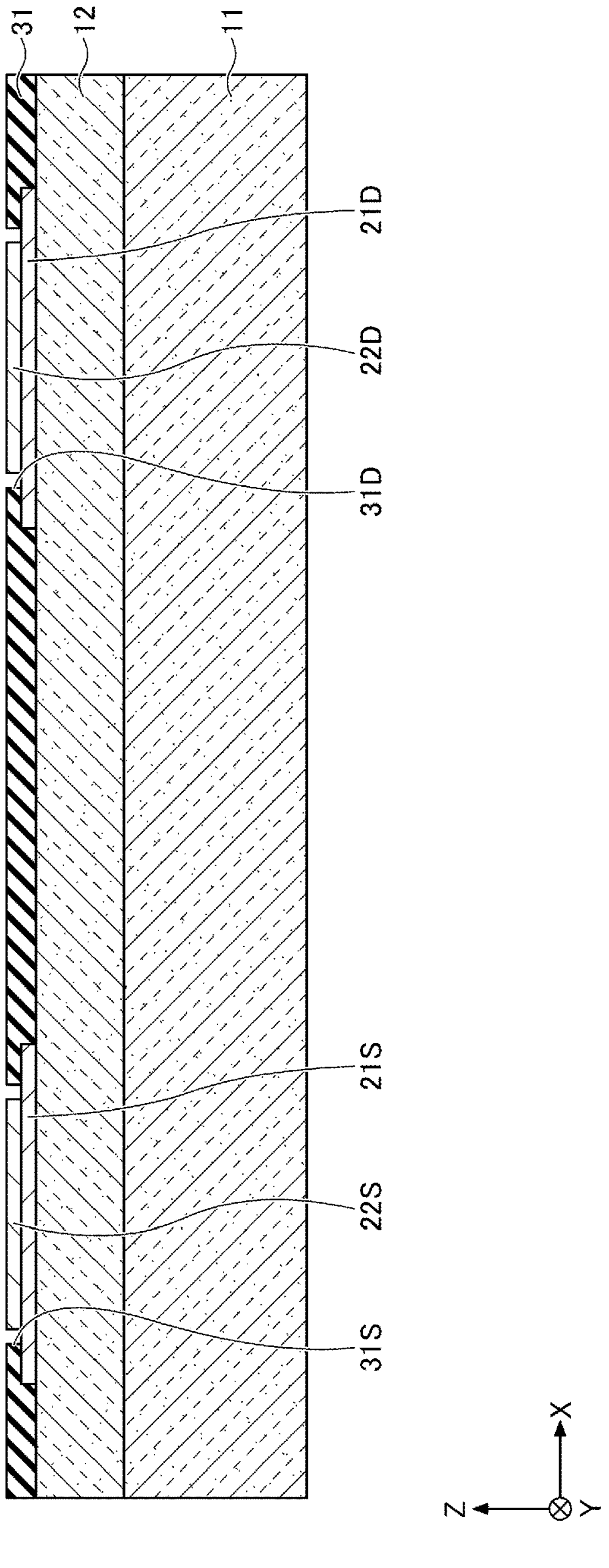
FIG. 5 is a cross-sectional view (3) illustrating the method of manufacturing the semiconductor device according to the first embodiment.

Next, as illustrated in FIG. 5, the barrier metal layer 22S is formed on the source electrode 21S inside the opening 31S, and the barrier metal layer 22D is formed on the drain electrode 21D inside the opening 31D. In the formation of the barrier metal layers 22S and 22D, a metal layer, for example, a TiW layer, is formed by, for example, a sputtering method, and patterning by etching using an etching mask is performed. After the barrier metal layers 22S and 22D are etched, the etching mask is removed.

Figure 6:
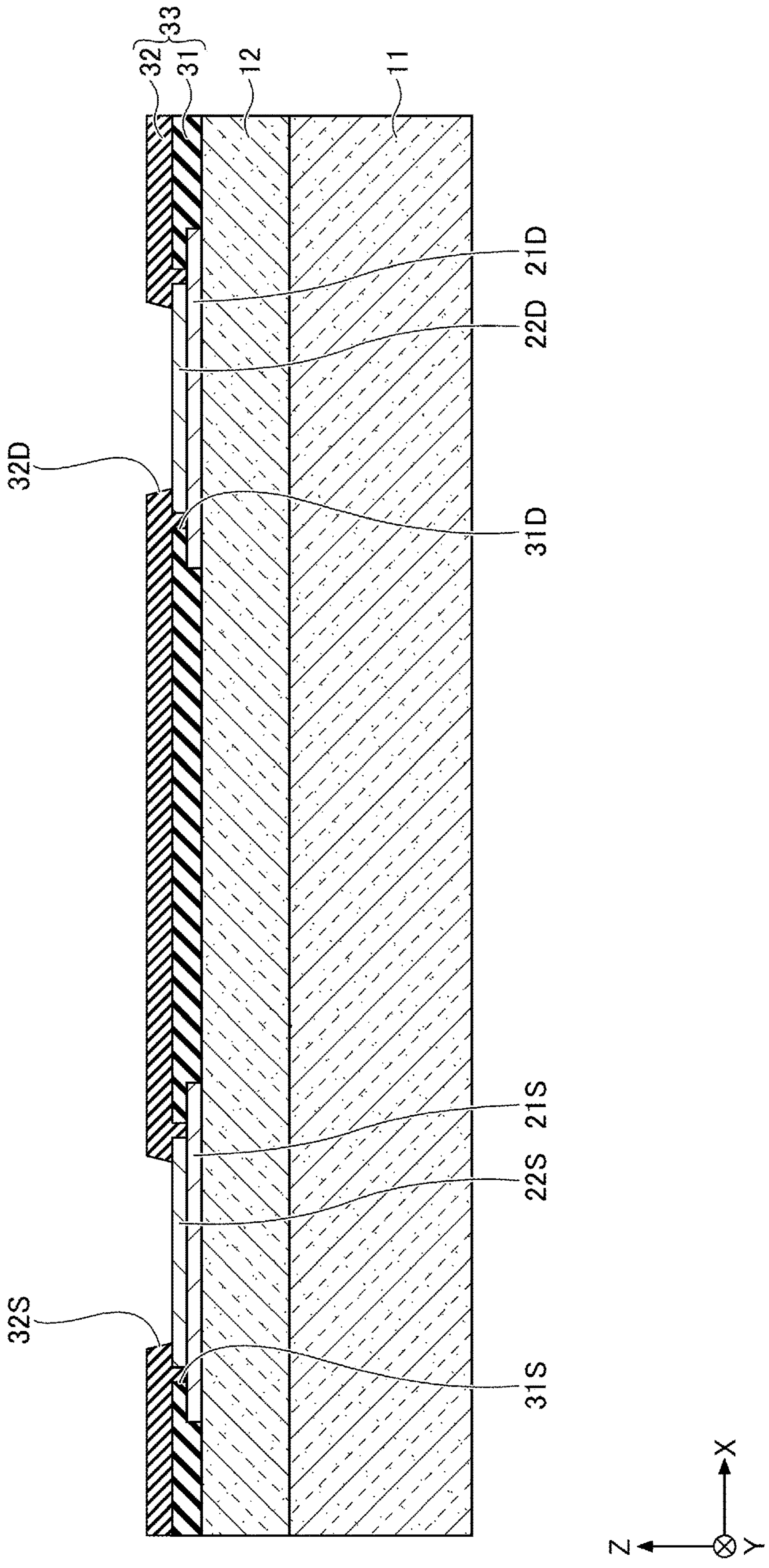
FIG. 6 is a cross-sectional view (4) illustrating the method of manufacturing the semiconductor device according to the first embodiment.

Next, as illustrated in FIG. 6, the insulating layer 32 covering the barrier metal layers 22S and 22D is formed on the insulating layer 31. The insulating layer 32 can be formed by, for example, a plasma CVD method. Next, the openings 32S and 32D are formed in the insulating layer 32. In the formation of the openings 32S and 32D, for example, RIE using a resist pattern as a mask is performed. For example, a reactive gas containing F is used for etching the insulating layer 32. After the etching of the insulating layer 32, the resist pattern is removed.

Figure 7:
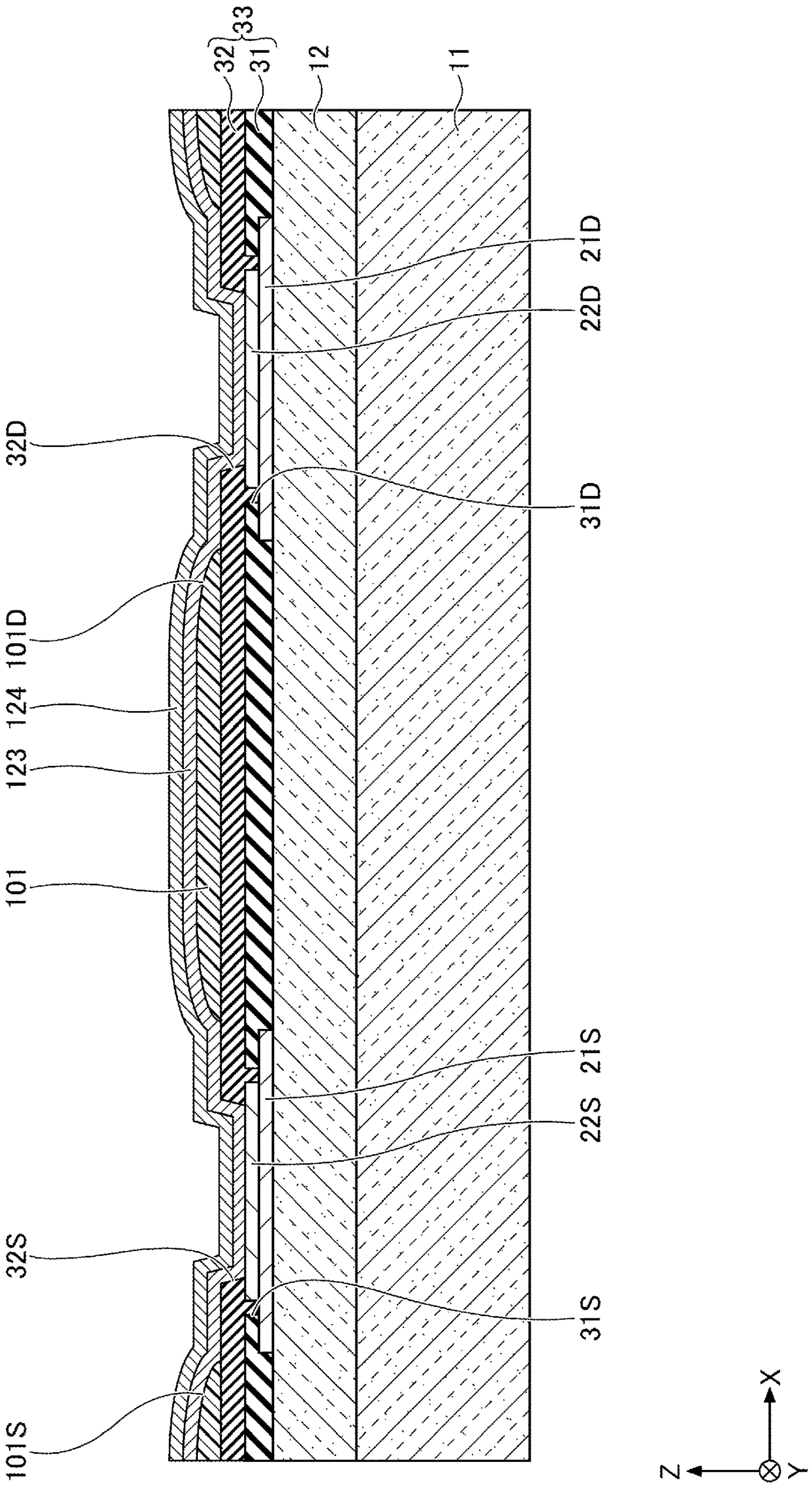
FIG. 7 is a cross-sectional view (5) illustrating the method of manufacturing the semiconductor device according to the first embodiment.

Next, as illustrated in FIG. 7, a resist pattern 101 is formed on the insulating layer 32. The resist pattern 101 has an opening 101S slightly larger than an area where the plating layer 25S is formed in plan view and an opening 101D slightly larger than an area where the plating layer 25D is formed in plan view. Next, a metal layer 123, for example, a Ti layer, which is to be the adhesion layers 23S and 23D, and a metal layer 124, for example, an Au layer, which is to be the seed layers 24S and 24D, are formed in this order on the entire upper surface. The metal layers 123 and 124 can be formed by, for example, a sputtering method.

Figure 8:
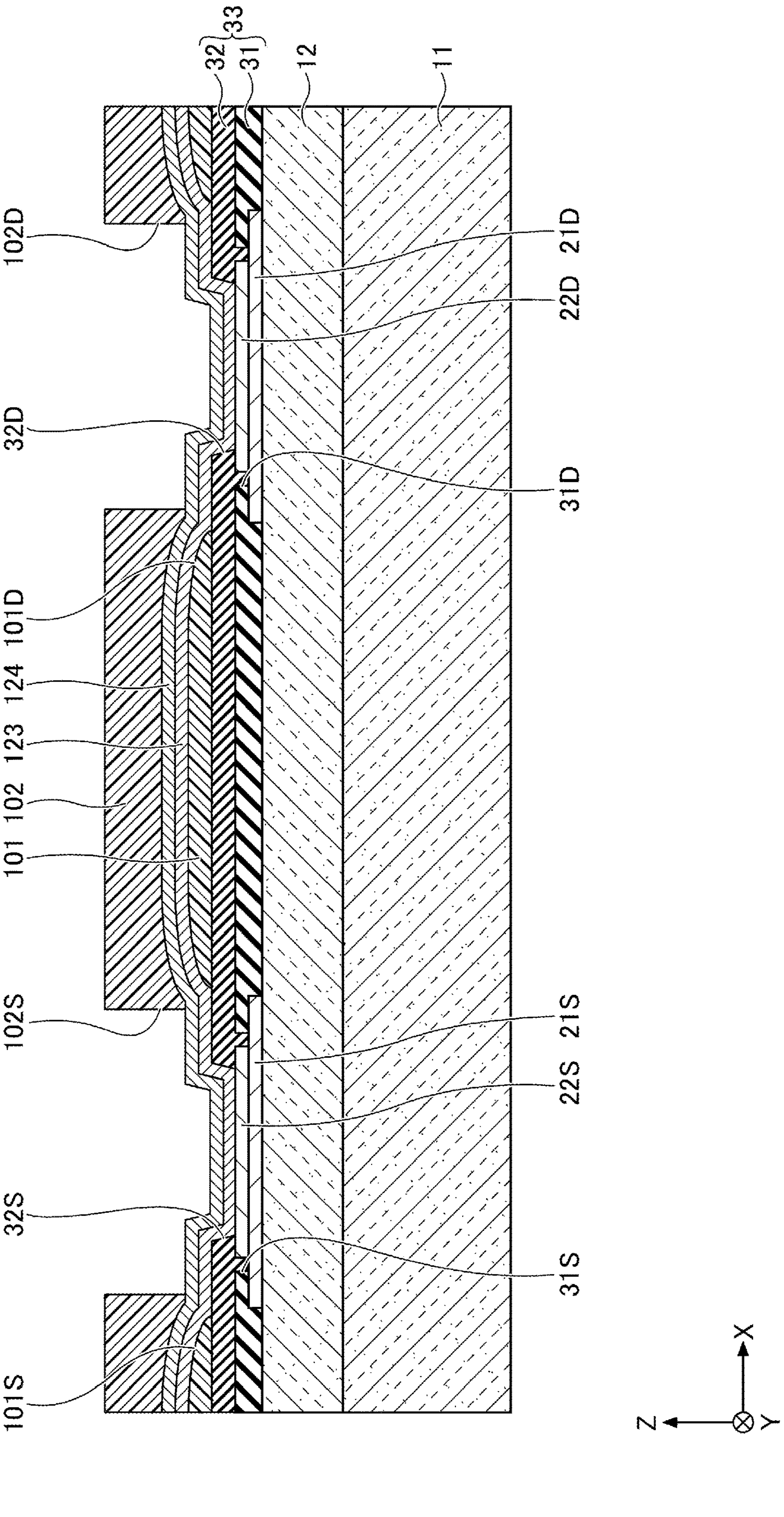
FIG. 8 is a cross-sectional view (6) illustrating the method of manufacturing the semiconductor device according to the first embodiment.

Next, as illustrated in FIG. 8, a resist pattern 102 is formed on the metal layer 124. The resist pattern 102 has an opening 102S where the plating layer 25S is to be formed and an opening 102D where the plating layer 25D is to be formed.

Figure 9:
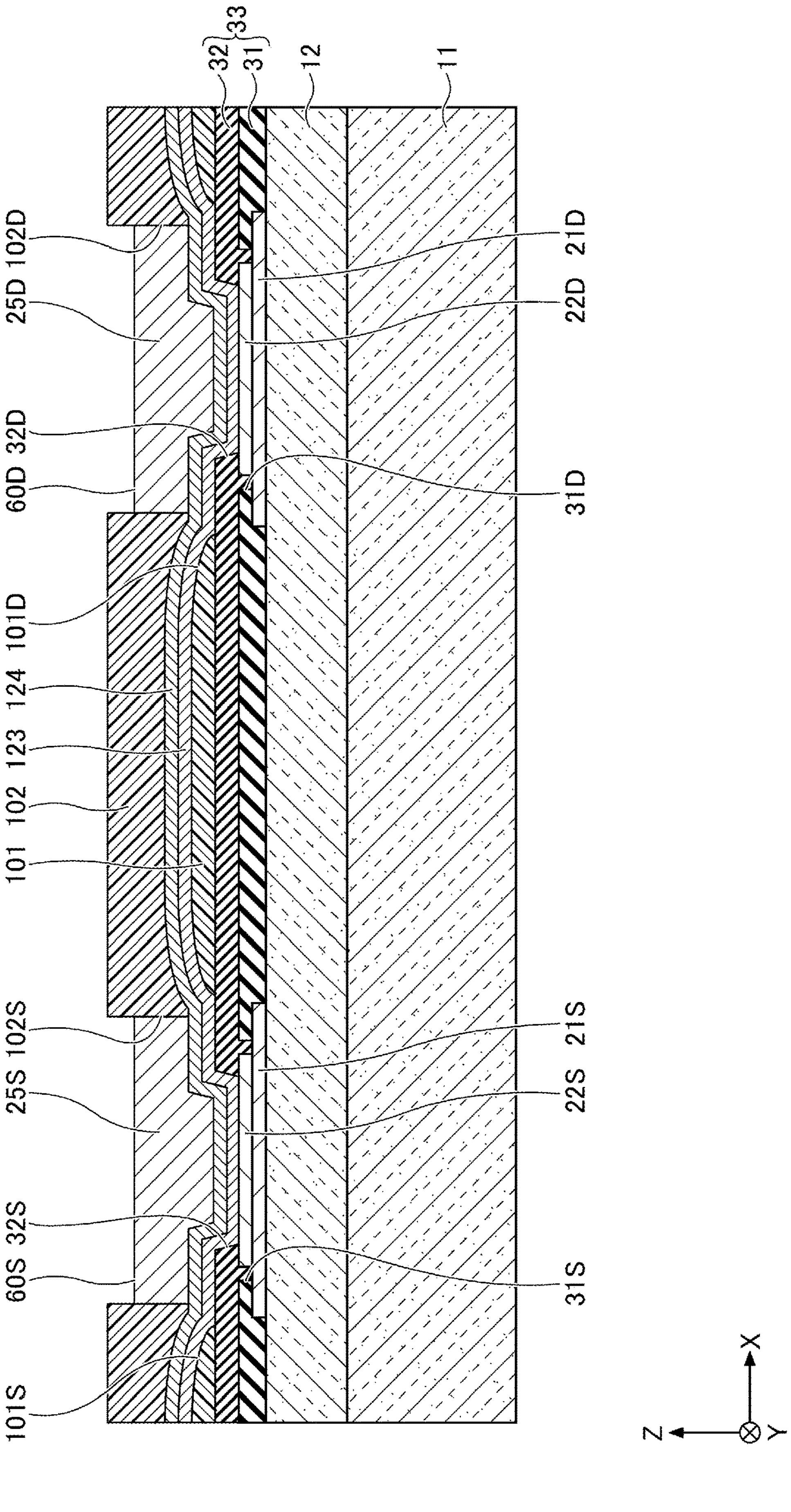
FIG. 9 is a cross-sectional view (7) illustrating the method of manufacturing the semiconductor device according to the first embodiment.

Next, as illustrated in FIG. 9, the plating layer 25S is formed on the metal layer 124 inside the opening 102S, and the plating layer 25D is formed on the metal layer 124 inside the opening 102D. In the formation of the plating layers 25S and 25D, for example, electrolytic plating using the metal layer 124 as a power feeding path is performed.

Figure 10:
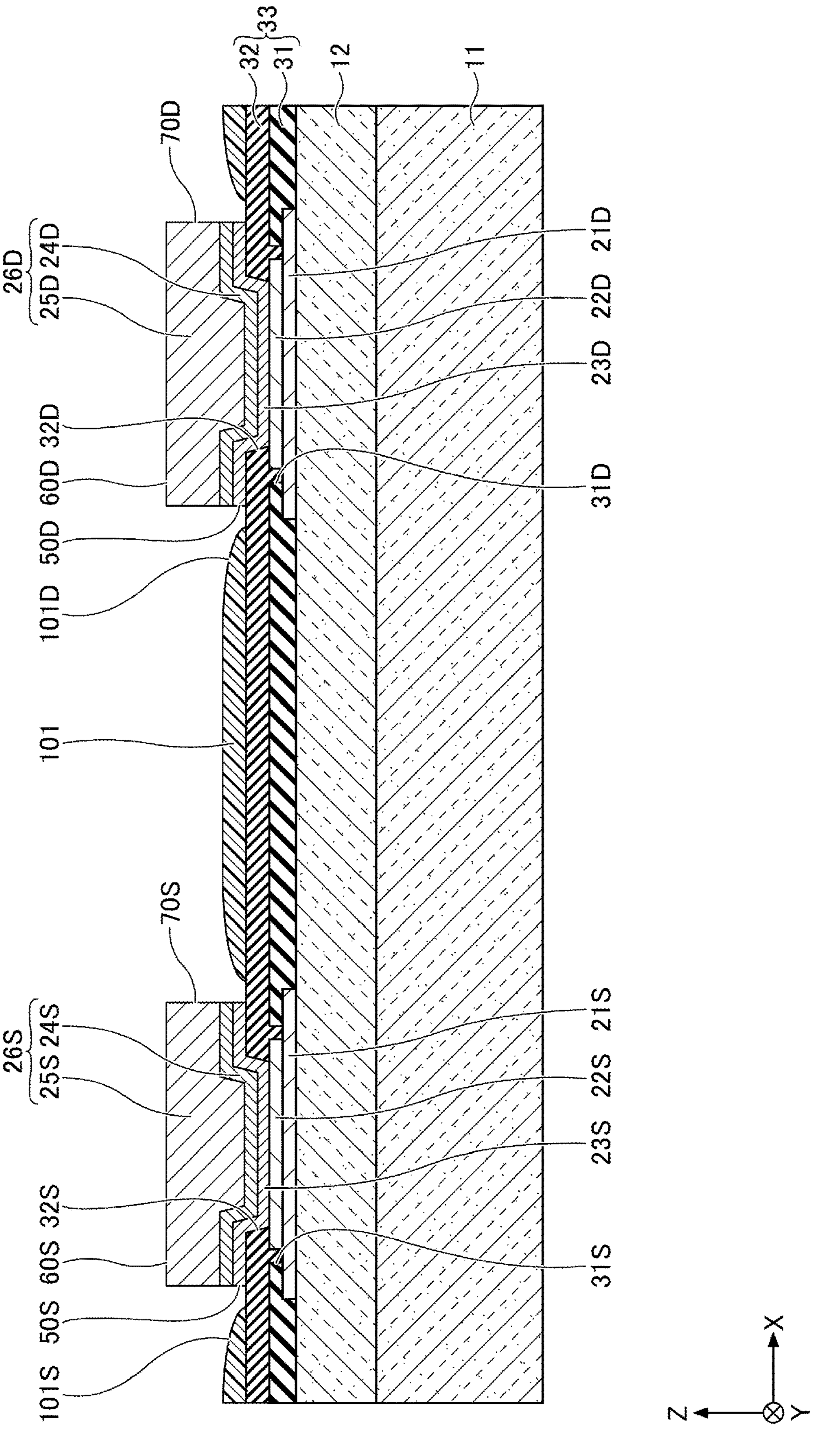
FIG. 10 is a cross-sectional view (8) illustrating the method of manufacturing the semiconductor device according to the first embodiment.

Next, as illustrated in FIG. 10, the resist pattern 102 is removed. Next, portions of the metal layers 124 and 123 that are not covered by the plating layer 25S or 25D are removed by etching. As a result, the adhesion layers 23S and 23D are formed from the metal layer 123, and the seed layers 24S and 24D are formed from the metal layer 124. In the direction parallel to the substrate 11, the width of the seed layer 24S is equal to the width of the adhesion layer 23S, and the width of the seed layer 24D is equal to the width of the adhesion layer 23D.

Figure 11:
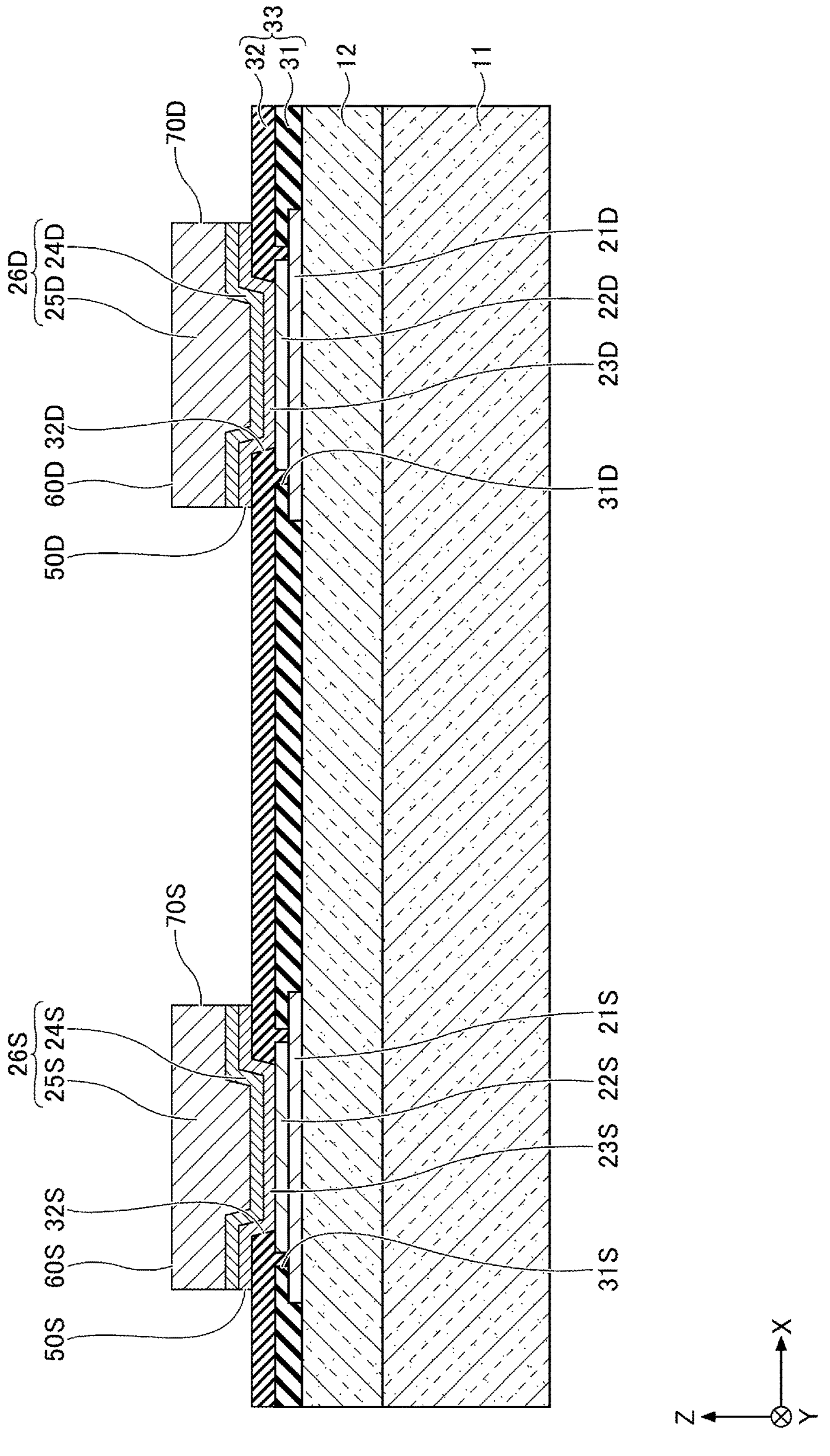
FIG. 11 is a cross-sectional view (9) illustrating the method of manufacturing the semiconductor device according to the first embodiment.

Next, as illustrated in FIG. 11, the resist pattern 101 is removed. Next, heat treatment is performed. For example, the temperature of the heat treatment is about 350° C., and the time of the heat treatment is about 30 minutes. As a result of the heat treatment, an impurity in the plating layer 25S, for example, carbon (C), is aggregated in the vicinity of the surface of the plating layer 25S, and an impurity in the plating layer 25D, for example, C, is aggregated in the vicinity of the surface of the plating layer 25D.

Figure 12:
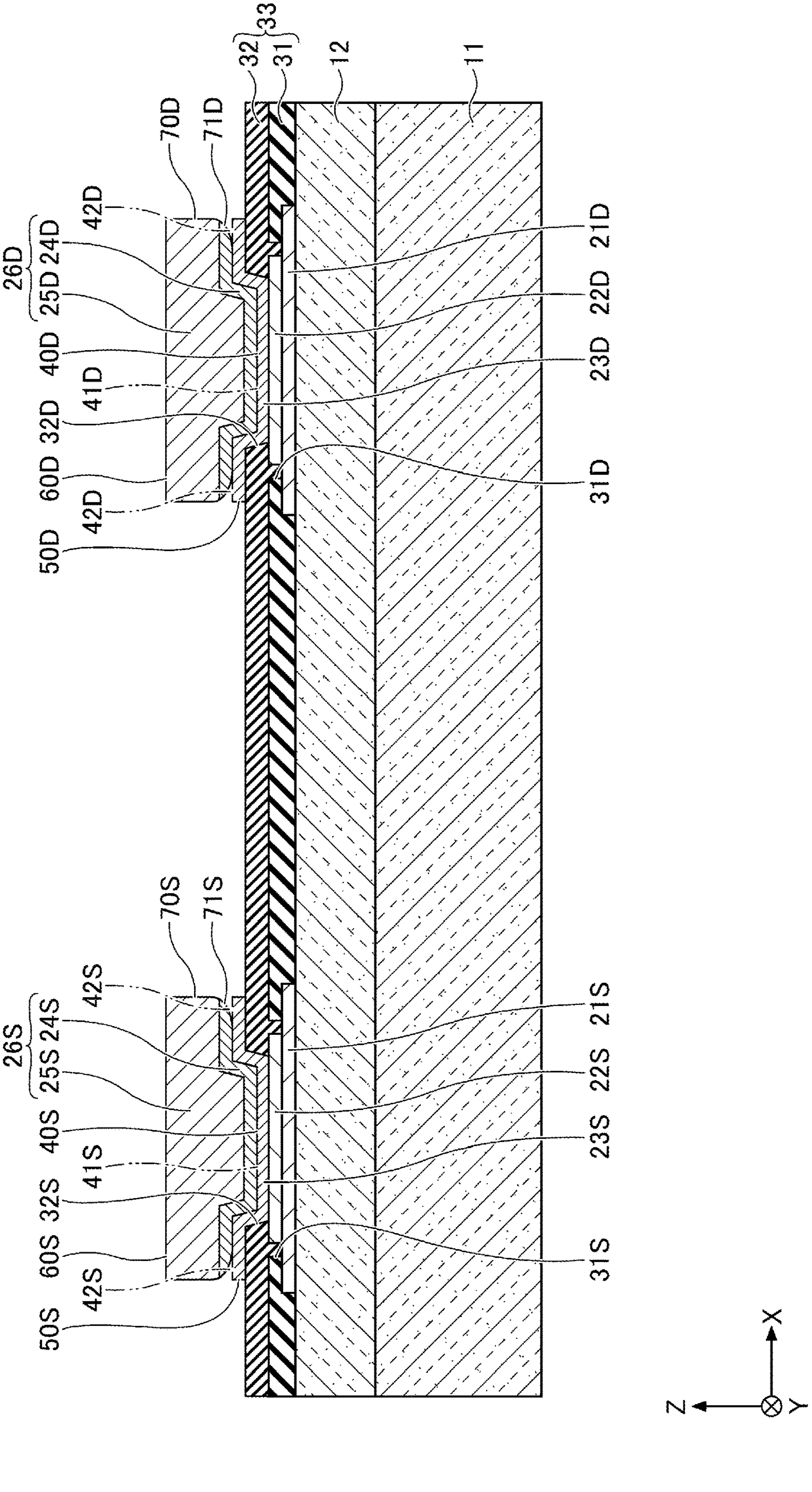
FIG. 12 is a cross-sectional view (10) illustrating the method of manufacturing the semiconductor device according to the first embodiment.

Next, a surface layer portion of the metal laminate 26S including the plating layer 25S and the seed layer 24S and a surface layer portion of the metal laminate 26D including the plating layer 25D and the seed layer 24D are removed by wet etching. When the metal laminates 26S and 26D are made of Au, an iodine-based etchant is used, for example. As a result of the wet etching, the portions where the impurity is aggregated is removed from the plating layers 25S and 25D. At this time, the etchant easily permeates the interface between the adhesion layer 23S and the metal laminate 26S and the interface between the adhesion layer 23D and the metal laminate 26D. Therefore, as illustrated in FIG. 12, a lower portion of the metal laminate 26S and a lower portion of the metal laminate 26D are preferentially etched, so that the curved surface 71S is formed on the side surface 70S of the metal laminate 26S, and the curved surface 71D is formed on the side surface 70D of the metal laminate 26D. As a result, the upper surface 40S of the adhesion layer 23S has the first region 41S that is in contact with the metal laminate 26S and the second region 42S that is separated from the metal laminate 26S. Similarly, the upper surface 40D of the adhesion layer 23D has the first region 41D that is in contact with the metal laminate 26D and the second region 42D that is separated from the metal laminate 26D.

Figure 13:
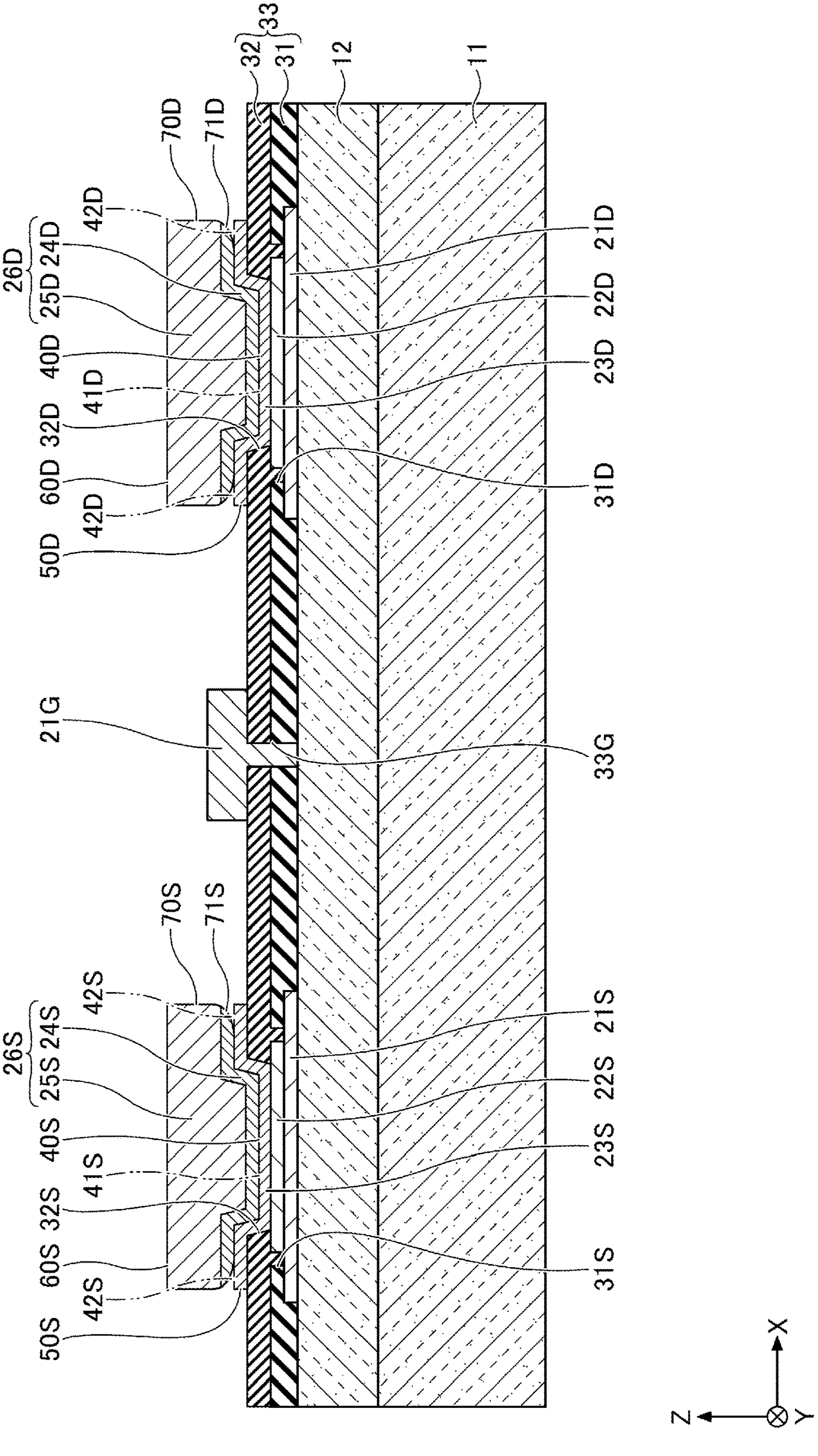
FIG. 13 is a cross-sectional view (11) illustrating the method of manufacturing the semiconductor device according to the first embodiment.

Next, as illustrated in FIG. 13, the opening 33G is formed in the interlayer insulating film 33 including the insulating layers 31 and 32. In the formation of the opening 33G, for example, RIE using a resist pattern as a mask is performed. For example, a reactive gas containing F is used for etching the interlayer insulating film 33. After the etching of the interlayer insulating film 33, the resist pattern is removed. Next, the gate electrode 21G that is in Schottky contact with the semiconductor layer 12 through the opening 33G is formed on the insulating layer 32. In the formation of the gate electrode 21G, a metal layer is grown by a vapor deposition method using a growing mask, and subsequently the growing mask is removed. That is, the gate electrode 21G can be formed by, for example, vapor deposition and lift-off.

Figure 14:
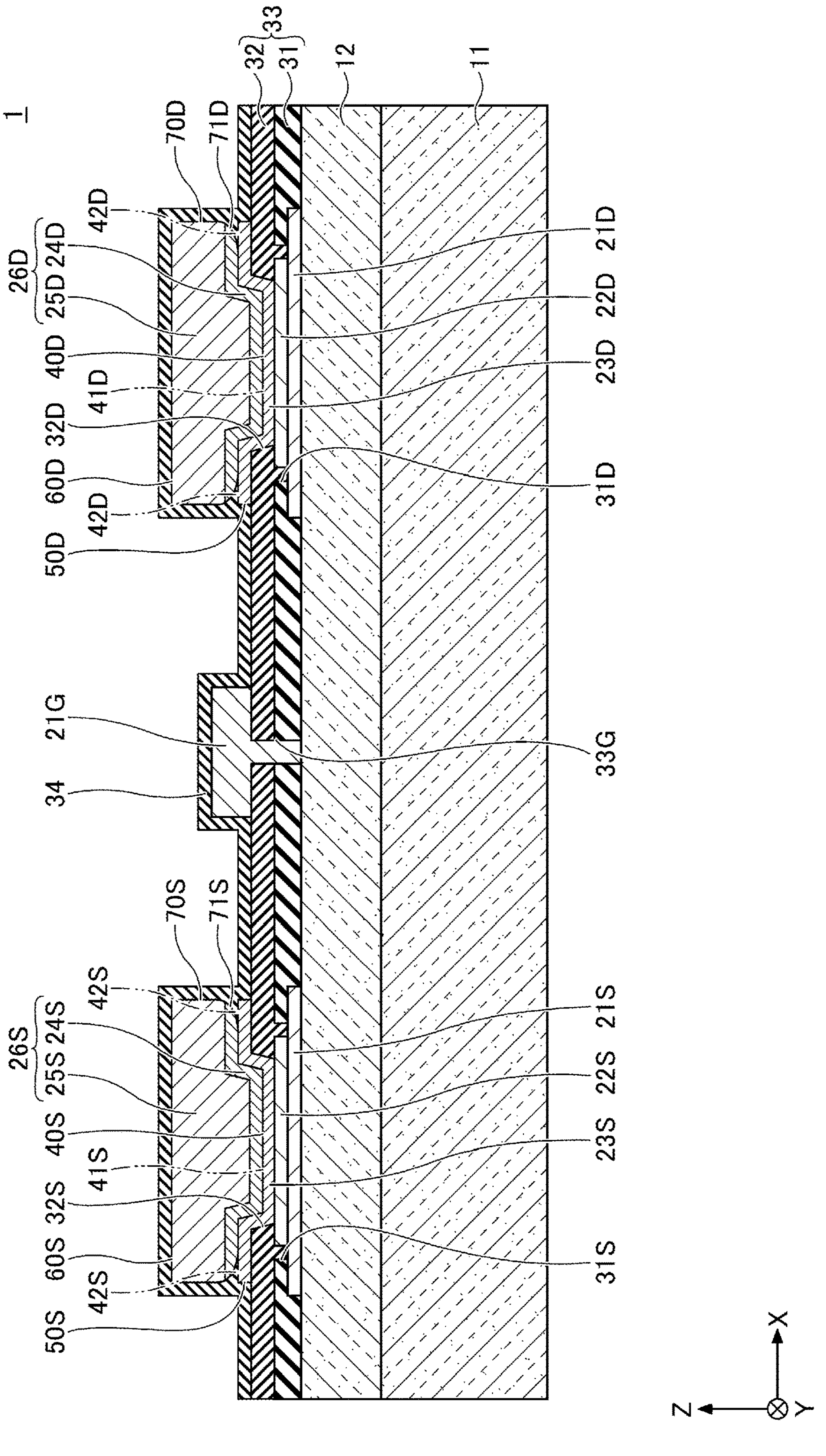
FIG. 14 is a cross-sectional view (12) illustrating the method of manufacturing the semiconductor device according to the first embodiment.

Next, as illustrated in FIG. 14, the insulating layer 34 is formed on the insulating layer 32. The insulating layer 34 can be formed by, for example, a plasma CVD method. The insulating layer 34 covers the metal laminate 26S, the adhesion layer 23S, the metal laminate 26D, the adhesion layer 23D, and the gate electrode 21G. The insulating layer 34 is in direct contact with the side surface 50S and the second region 42S of the adhesion layer 23S and the upper surface 60S and the side surface 70S of the metal laminate 26S. The insulating layer 34 is in direct contact with the side surface 50D and the second region 42D of the adhesion layer 23D and the upper surface 60D and the side surface 70D of the metal laminate 26D.

As described above, the semiconductor device 1 according to the first embodiment can be manufactured.

In the semiconductor device 1 according to the first embodiment, the upper surface 40S of the adhesion layer 23S has the second region 42S separated from the metal laminate 26S, and the insulating layer 34 is also in direct contact with the second region 42S. Thus, in comparison with the case where the insulating layer 34 is not in direct contact with the upper surface 40S of the adhesion layer 23S, the contact area between the insulating layer 34 and the adhesion layer 23S is large, and good adhesion is obtained between the insulating layer 34 and the laminated structure of the adhesion layer 23S and the metal laminate 26S. Therefore, the peeling of the insulating layer 34 from the laminated structure of the adhesion layer 23S and the metal laminate 26S can be prevented.

Similarly, the upper surface 40D of the adhesion layer 23D has the second region 42D separated from the metal laminate 26D, and the insulating layer 34 is also in direct contact with the second region 42D. Thus, in comparison with the case where the insulating layer 34 is not in direct contact with the upper surface 40D of the adhesion layer 23D, the contact area between the insulating layer 34 and the adhesion layer 23D is large, and good adhesion is obtained between the insulating layer 34 and the laminated structure of the adhesion layer 23D and the metal laminate 26D. Therefore, the peeling of the insulating layer 34 from the laminated structure of the adhesion layer 23D and the metal laminate 26D can be prevented.

Additionally, due to the adhesion layer 23S, good adhesion is obtained between the insulating layer 32 and the metal laminate 26S, and due to the adhesion layer 23D, good adhesion is obtained between the insulating layer 32 and the metal laminate 26D.

The adhesion between the insulating layer 34 and the adhesion layer 23S is higher than the adhesion between the insulating layer 34 and the metal laminate 26S, so that good adhesion is obtained between the insulating layer 34 and the laminated structure of the adhesion layer 23S and the metal laminate 26S, even when the adhesion between the insulating layer 34 and the metal laminate 26S is low. Similarly, the adhesion between the insulating layer 34 and the adhesion layer 23D is higher than the adhesion between the insulating layer 34 and the metal laminate 26D, so that good adhesion is obtained between the insulating layer 34 and the laminated structure of the adhesion layer 23D and the metal laminate 26D, even when the adhesion between the insulating layer 34 and the metal laminate 26D is low.

When the metal laminate 26S is an Au layer, a low electric resistance is easily obtained in the metal laminate 26S, and when the metal laminate 26D is an Au layer, a low electric resistance is easily obtained in the metal laminate 26D. Additionally, when the adhesion layer 23S is a Ti layer, a TiW alloy layer, a Ta layer, a Cr layer, a Mo layer, or a Nb layer, good adhesion is easily obtained between the insulating layer 32 and the metal laminate 26S. When the adhesion layer 23D is a Ti layer, a TiW alloy layer, a Ta layer, a Cr layer, a Mo layer, or a Nb layer, good adhesion is easily obtained between the insulating layer 32 and the metal laminate 26D.

When the insulating layer 34 is a SiN layer, the metal laminate 26S, the metal laminate 26D, the adhesion layer 23S, and the adhesion layer 23D are easily protected from the entry of moisture or the like.

When the second region 42S has an enclosed shape and the average value of the widths WS of the second region 42S is 0.10 μm or greater in plan view, a sufficient contact area is easily obtained between the adhesion layer 23S and the insulating layer 34. When the second region 42D has an enclosed shape and the average value of the widths WS of the second region 42D is 0.10 μm or greater in plan view, a sufficient contact area is easily obtained between the adhesion layer 23D and the insulating layer 34. The average value of the widths WS of the second region 42S and the average value of the widths WD of the second region 42D may be 0.15 μm or greater, 0.20 μm or greater, 0.30 μm or greater, or 0.50 μm or greater. As the average value of the widths WS of the second region 42S and the average value of the widths WD of the second region 42D increase, increased contact areas are easily obtained between the adhesion layers 23S and 23D; and the insulating layer 34.

The curved surface 71S of the side surface 70S of the metal laminate 26S is curved in a direction in which a center of an osculating circle is located inside the curved surface 71S when viewed from the metal laminate 26S, so that the metal laminate 26S is easily separated from the second region 42S. Similarly, the curved surface 71D of the side surface 70D of the metal laminate 26D is curved in a direction in which a center of an osculating circle is located inside the curved surface 71D when viewed from the metal laminate 26D, so that the metal laminate 26D is easily separated from the second region 42D.

Additionally, the portions where the impurity is aggregated are removed from the plating layers 25S and 25D by the wet etching, thereby improving the adhesion between the plating layers 25S and 25D; and the insulating layer 34.

Second Embodiment

Figure 15:
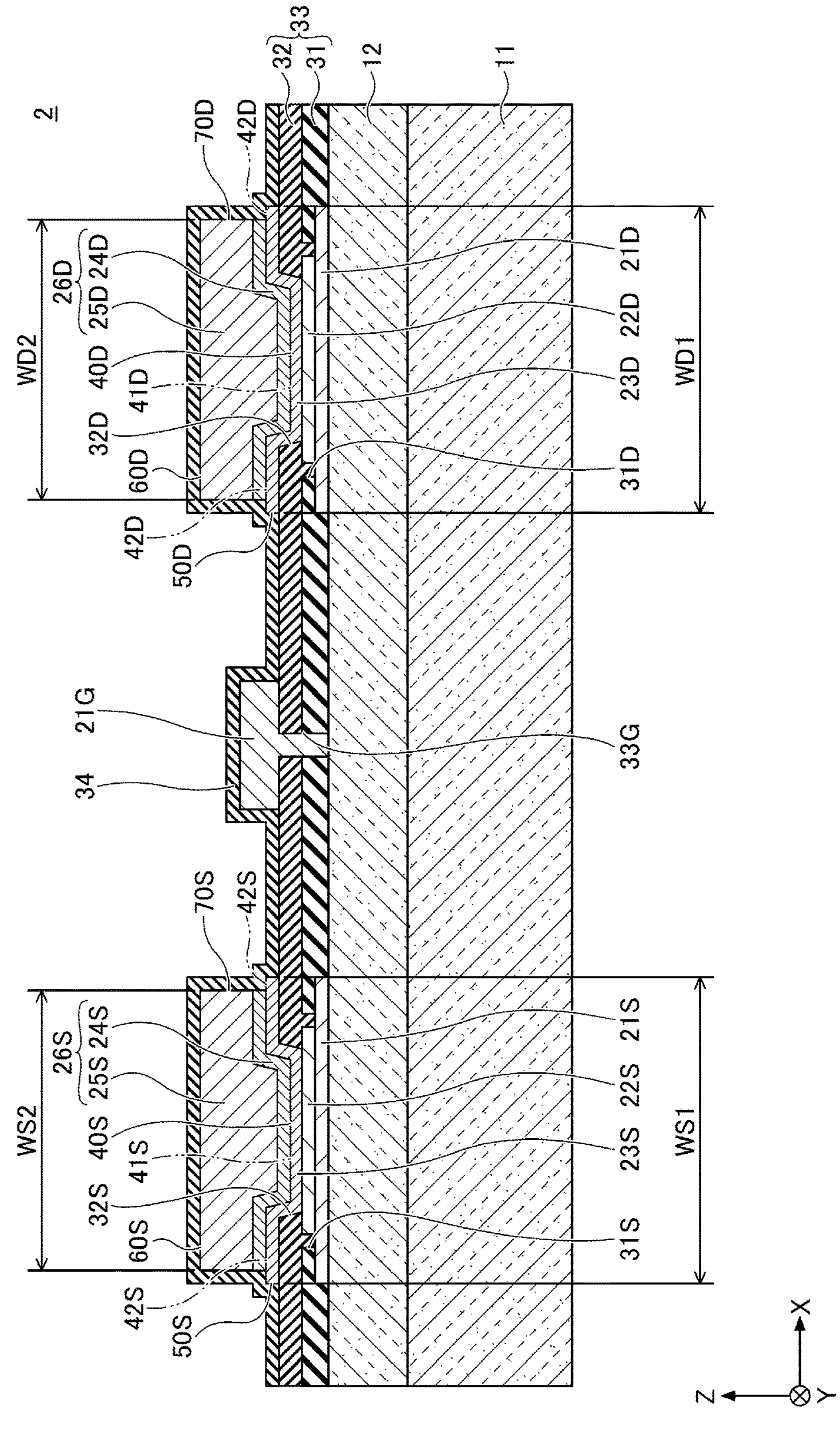
FIG. 15 is a cross-sectional view illustrating a semiconductor device according to a second embodiment.

A second embodiment will be described. The second embodiment is different from the first embodiment mainly in the configurations of the adhesion layer and the metal laminate. FIG. 15 is a cross-sectional view illustrating a semiconductor device according to the second embodiment.

As illustrated in FIG. 15, in a semiconductor device 2 according to the second embodiment, in plan view, the side surface 50S of the adhesion layer 23S is located outside the side surface of the metal laminate 26S, and the side surface 50D of the adhesion layer 23D is located outside the side surface of the metal laminate 26D. That is, in the direction parallel to the substrate 11, the width WS1 of the adhesion layer 23S is greater than the width WS2 of the metal laminate 26S, and the width WD1 of the adhesion layer 23D is greater than the width WD2 of the metal laminate 26D. The side surface 70S of the metal laminate 26S does not have the curved surface 71S, and the side surface 70D of the metal laminate 26D does not have the curved surface 71D.

The other configurations are the same as those of the first embodiment.

For example, the upper surface 40S of the adhesion layer 23S has the first region 41S and the second region 42S, and the upper surface 40D of the adhesion layer 23D has the first region 41D and the second region 42D. The metal laminate 26S is in contact with the first region 41S of the upper surface 40S of the adhesion layer 23S and is separated from the second region 42S. From another viewpoint, the first region 41S is in contact with the metal laminate 26S, and the second region 42S is separated from the metal laminate 26S. The metal laminate 26D is in contact with the first region 41D of the upper surface 40D of the adhesion layer 23D and is separated from the second region 42D. From another viewpoint, the first region 41D is in contact with the metal laminate 26D, and the second region 42D is separated from the metal laminate 26D.

Additionally, the insulating layer 34 is in direct contact with the side surface 50S and the second region 42S of the adhesion layer 23S and the upper surface 60S and the side surface 70S of the metal laminate 26S. The insulating layer 34 is in direct contact with the side surface 50D and the second region 42D of the adhesion layer 23D and the upper surface 60D and the side surface 70D of the metal laminate 26D.

Next, a method of manufacturing the semiconductor device 2 according to the second embodiment will be described. FIG. 16 to FIG. 22 are cross-sectional views illustrating the method for manufacturing the semiconductor device 2 according to the second embodiment.

Figure 16:
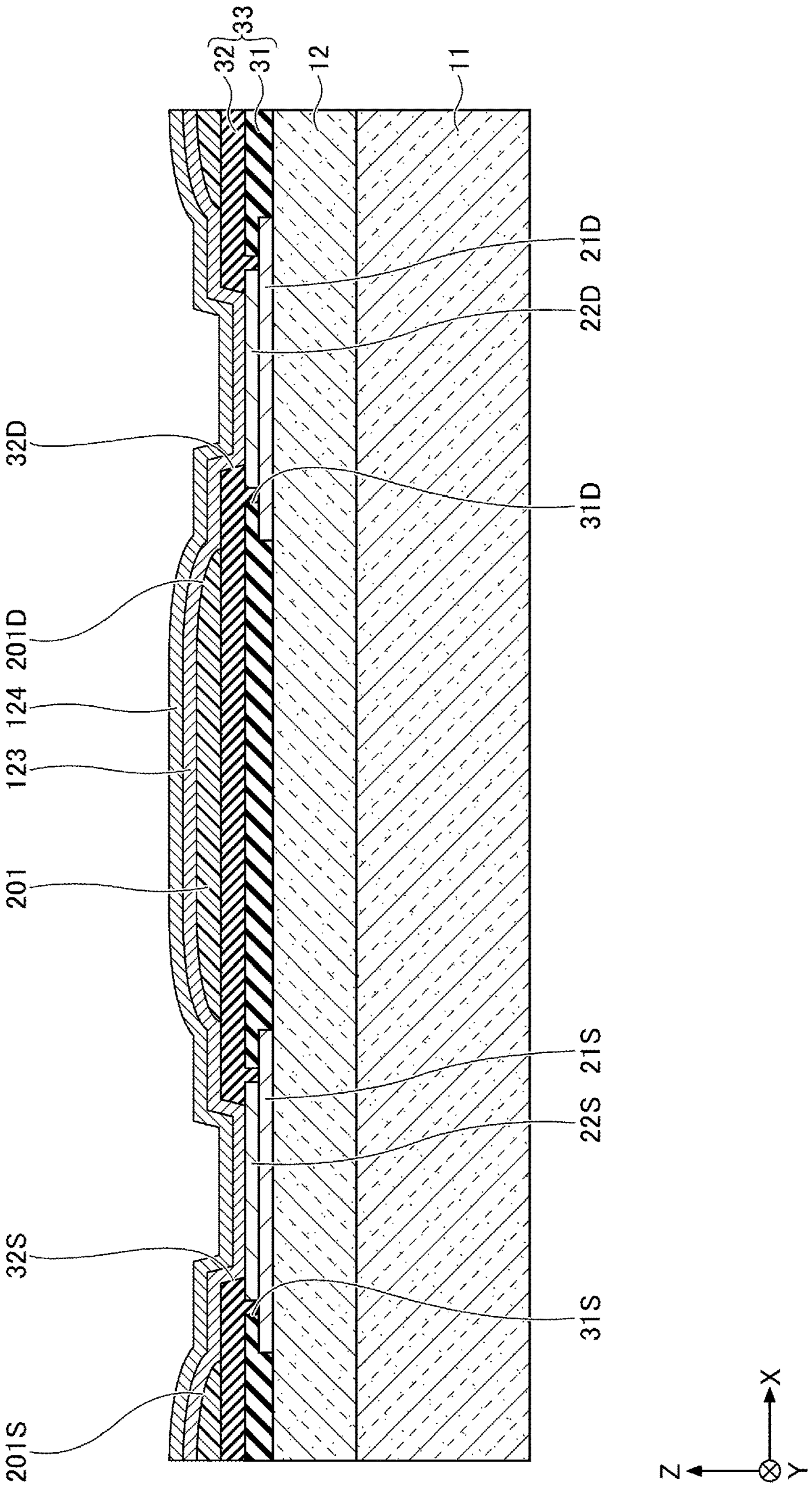
FIG. 16 is a cross-sectional view (1) illustrating a method of manufacturing the semiconductor device according to the second embodiment.

First, as in the first embodiment, the processes up to the formation of the opening 32S and 32D are performed (see FIG. 6). Next, as illustrated in FIG. 16, a resist pattern 201 is formed on the insulating layer 32 instead of the resist pattern 101. The resist pattern 201 has an opening 201S slightly larger than the opening 101S of the resist pattern 101 and an opening 201D slightly larger than the opening 101D of the resist pattern 101. Next, as in the first embodiment, the metal layer 123 and the metal layer 124 are formed in this order. The metal layers 123 and 124 can be formed by, for example, a sputtering method.

Figure 17:
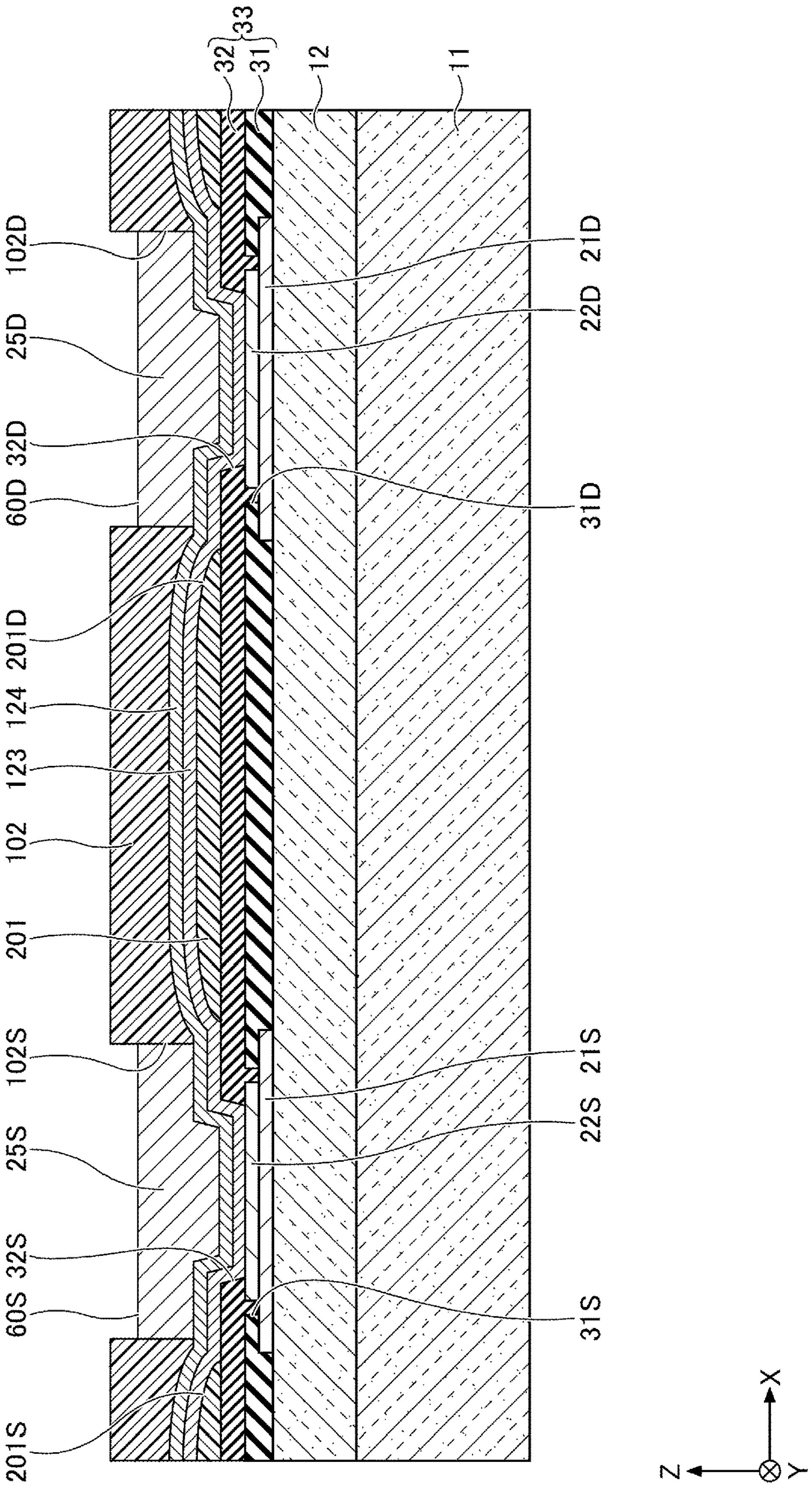
FIG. 17 is a cross-sectional view (2) illustrating the method of manufacturing the semiconductor device according to the second embodiment.

Next, as illustrated in FIG. 17, as in the first embodiment, the resist pattern 102 is formed on the metal layer 124, the plating layer 25S is formed on the metal layer 124 inside the opening 102S, and the plating layer 25D is formed on the metal layer 124 inside the opening 102D.

Figure 18:
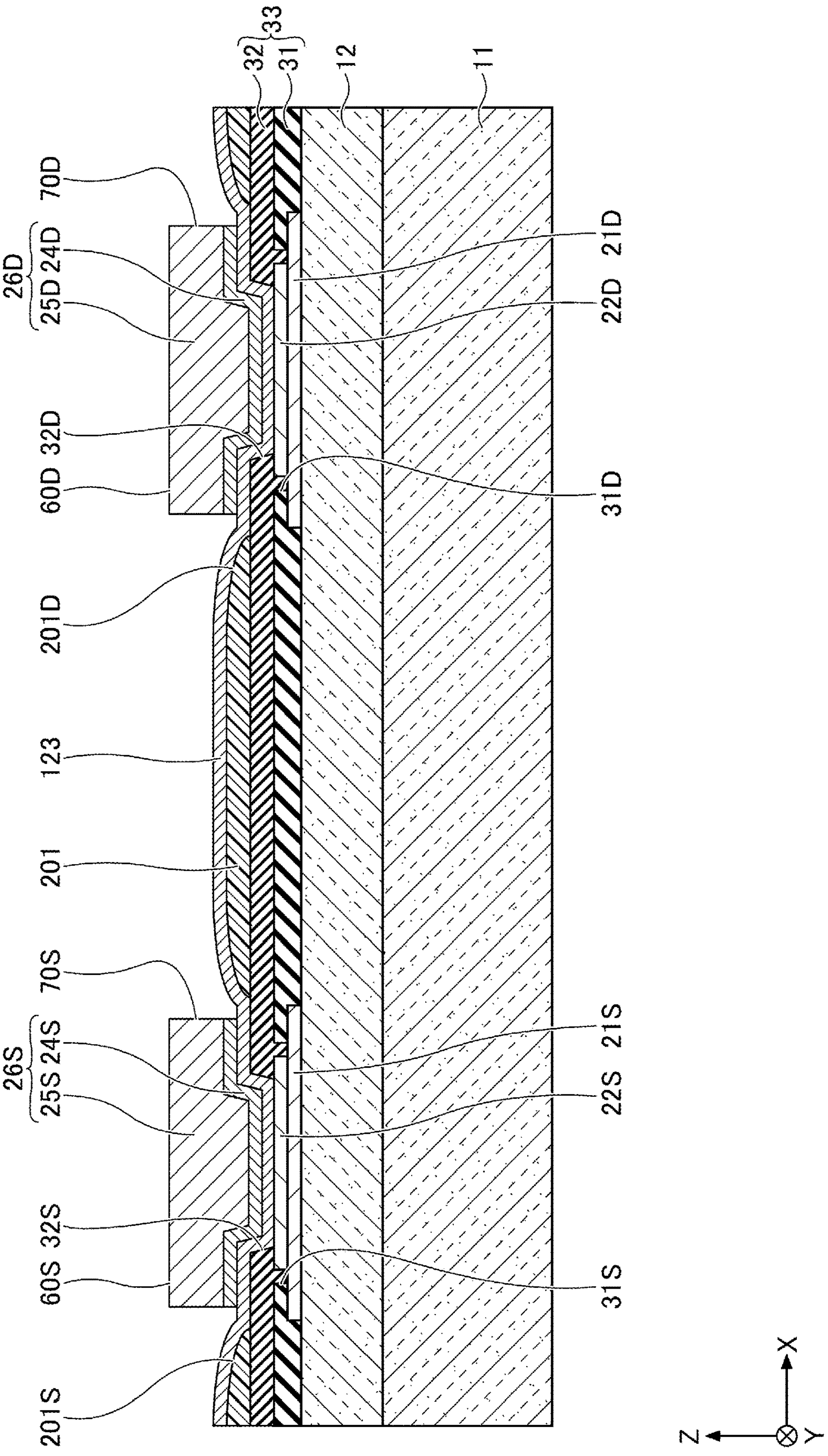
FIG. 18 is a cross-sectional view (3) illustrating the method of manufacturing the semiconductor device according to the second embodiment.

Next, as illustrated in FIG. 18, as in the first embodiment, the resist pattern 102 is removed, and the portion of the metal layer 124 that is not covered by the plating layers 25S and 25D is removed by etching. As a result, the seed layers 24S and 24D are formed from the metal layer 124. However, unlike the first embodiment, the metal layer 123 is remained. The metal layer 123 in the second embodiment is an example of a third metal layer.

Figure 19:
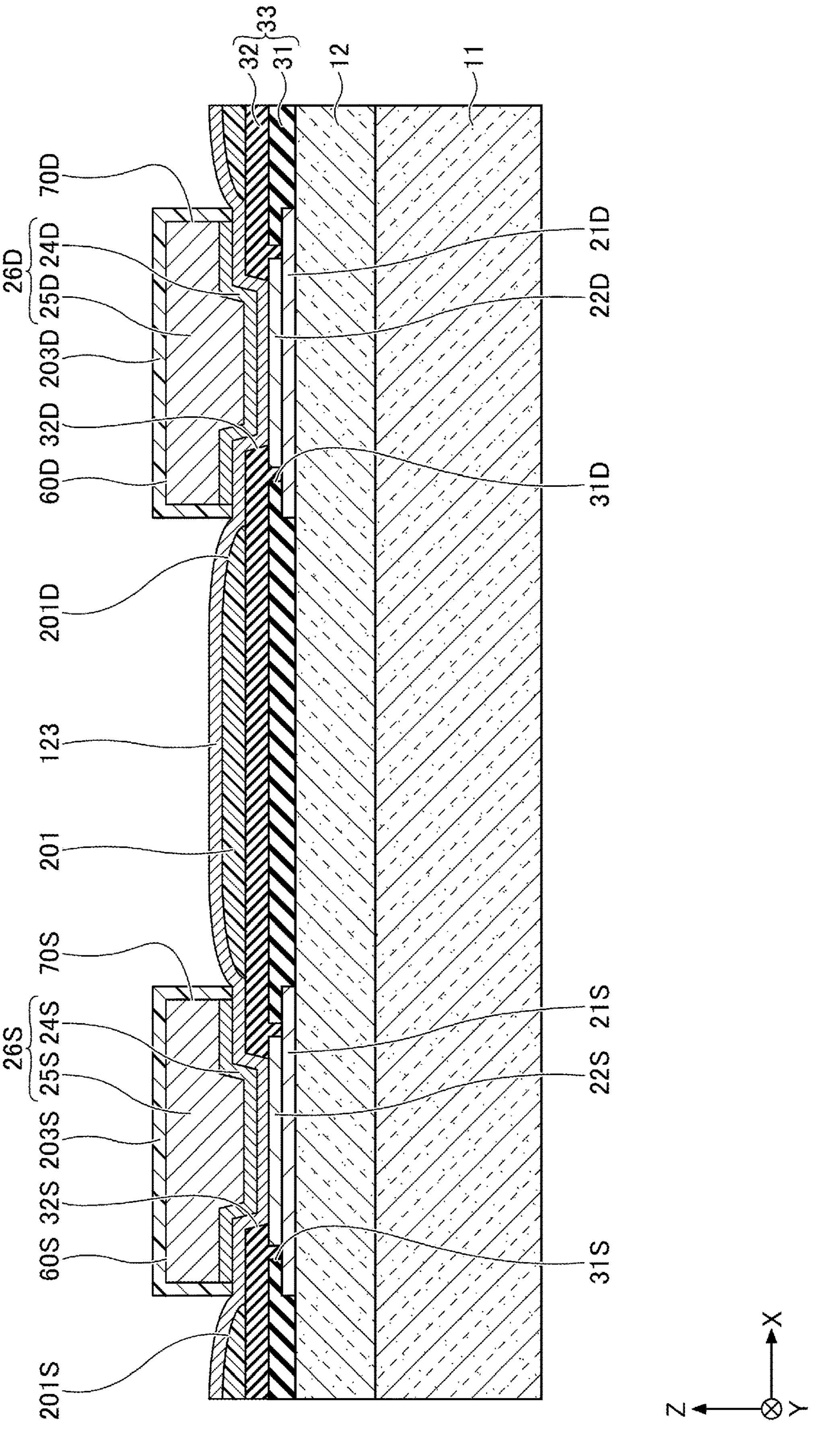
FIG. 19 is a cross-sectional view (4) illustrating the method of manufacturing the semiconductor device according to the second embodiment.

Next, as illustrated in FIG. 19, an etching mask 203S covering the surface of the metal laminate 26S including the plating layer 25S and the seed layer 24S and an etching mask 203D covering the surface of the metal laminate 26D including the plating layer 25D and the seed layer 24D are formed on and over the metal layer 123. The etching mask 203S also covers a portion of the upper surface 40S of the adhesion layer 23S, which is to be the second region 42S, and the etching mask 203D also covers a portion of the upper surface 40D of the adhesion layer 23D, which is to be the second region 42D. The etching masks 203S and 203D are, for example, resist masks.

Figure 20:
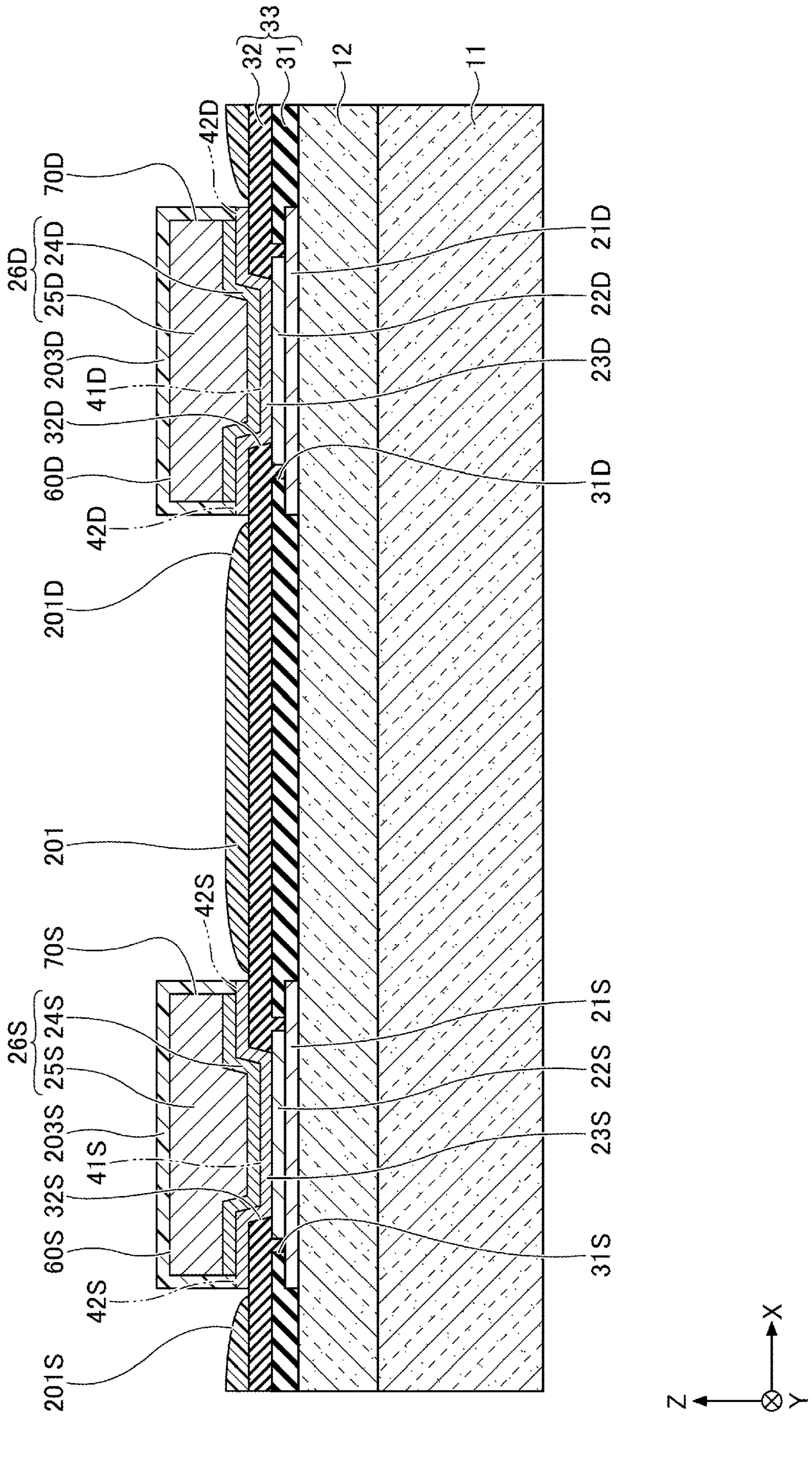
FIG. 20 is a cross-sectional view (5) illustrating the method of manufacturing the semiconductor device according to the second embodiment.

Next, as illustrated in FIG. 20, a portion of the metal layer 123 that is not covered by the etching mask 203S or 203D is removed by etching. As a result, the adhesion layers 23S and 23D are formed from the metal layer 123. In the direction parallel to the substrate 11, the width of the seed layer 24S is less than the width of the adhesion layer 23S, and the width of the seed layer 24D is less than the adhesion layer 23D. Additionally, in the direction parallel to the substrate 11, the width of the adhesion layer 23S is greater than the width of the metal laminate 26S, and the width of the adhesion layer 23D is greater than the width of the metal laminate 26D.

Figure 21:
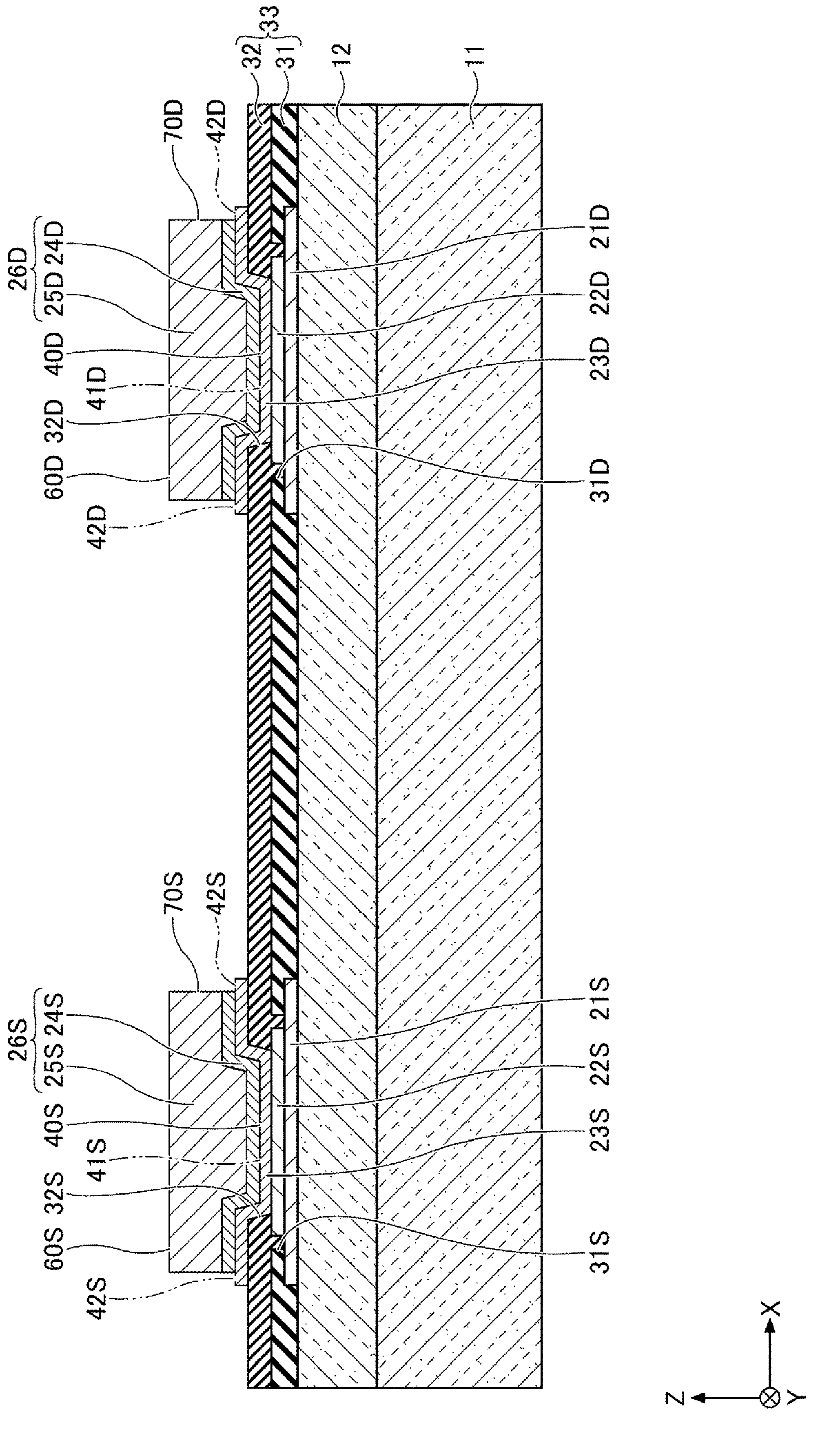
FIG. 21 is a cross-sectional view (6) illustrating the method of manufacturing the semiconductor device according to the second embodiment.

Next, as illustrated in FIG. 21, the resist pattern 201, the etching mask 203S, and the etching mask 203D are removed. Next, as in the first embodiment, heat treatment is performed. As a result of the heat treatment, an impurity in the plating layer 25S, for example, C, is aggregated in the vicinity of the surface of the plating layer 25S, and an impurity in the plating layer 25D, for example, C, is aggregated in the vicinity of the surface of the plating layer 25D. Next, a surface layer portion of the metal laminate 26S including the plating layer 25S and the seed layer 24S and a surface layer portion of the metal laminate 26D including the plating layer 25D and the seed layer 24D are removed by dry etching. As a result of the dry etching, the portions where the impurity is aggregated are removed from the plating layers 25S and 25D.

Figure 22:
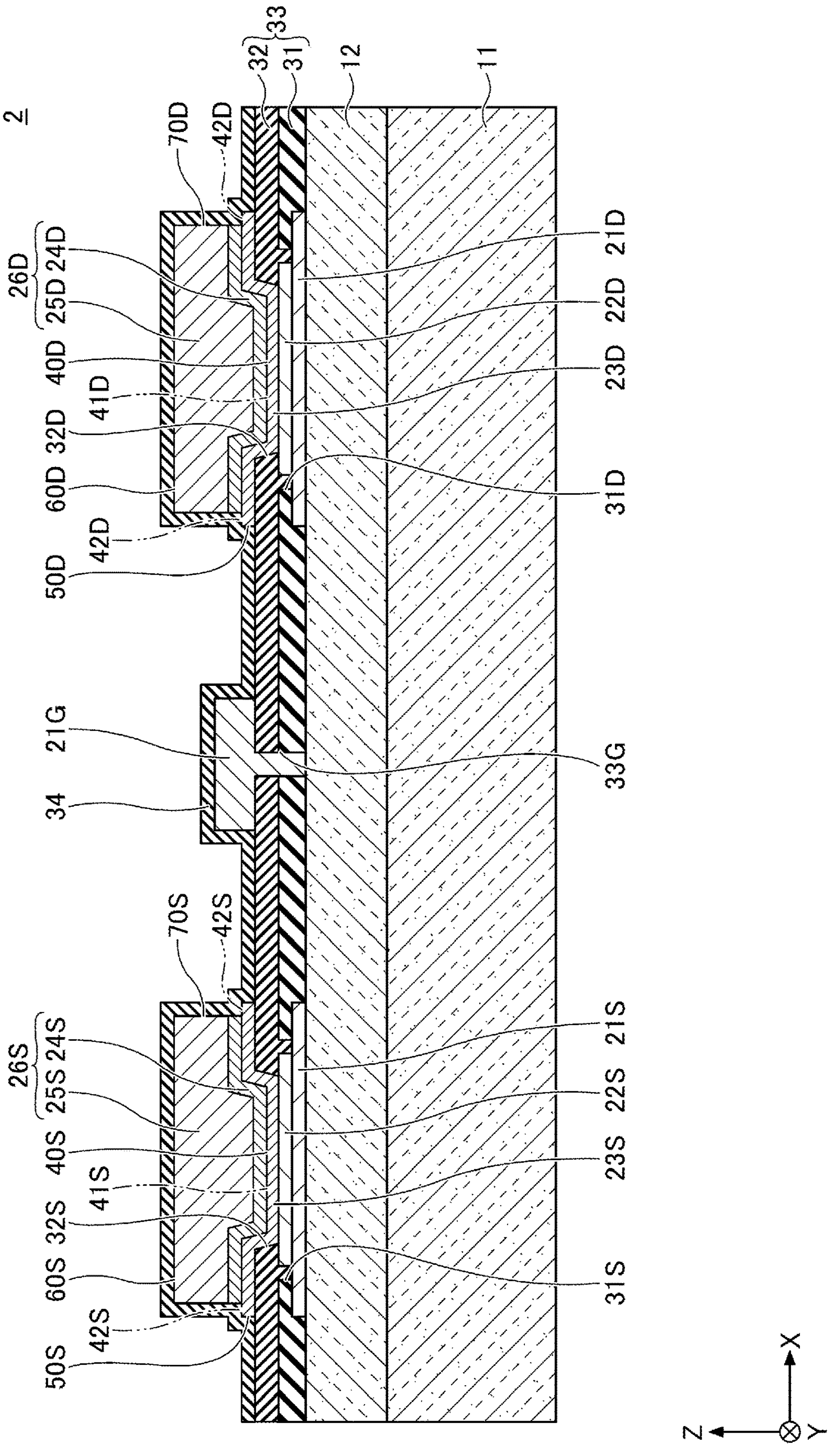
FIG. 22 is a cross-sectional view (7) illustrating the method of manufacturing the semiconductor device according to the second embodiment.

Next, as illustrated in FIG. 22, as in the first embodiment, the processes from the formation of the opening 33G are performed.

As described above, the semiconductor device 2 according to the second embodiment can be manufactured.

The semiconductor device 2 according to the second embodiment also provides the same effects as those of the first embodiment.

Additionally, the portions where the impurity is aggregated are removed from the plating layers 25S and 25D by the dry etching, thereby improving the adhesion between the plating layers 25S and 25D and the insulating layer 34.

Although the embodiments have been described in detail, the present disclosure is not limited to the specific embodiments, and various modifications and changes can be made within the scope described in the claims.

What is claimed is:

1. A semiconductor device comprising:
a substrate;
a first insulating layer provided over the substrate;
a first metal layer provided on the first insulating layer;
a second metal layer provided on the first metal layer; and
a second insulating layer covering the first metal layer and the second metal layer,
wherein an upper surface of the first metal layer has a first region that is in contact with the second metal layer, and a second region that is separated from the second metal layer,
wherein the second insulating layer is in direct contact with a side surface and the second region of the first metal layer and an upper surface and a side surface of the second metal layer,
wherein a width of the first metal layer is greater than or equal to a width of the second metal layer in a direction parallel to the substrate, and
wherein the second insulating layer is a silicon nitride layer.

2. The semiconductor device as claimed in claim 1, wherein the second metal layer is a gold layer.

3. The semiconductor device as claimed in claim 2, wherein the first metal layer is a titanium layer, a titanium tungsten alloy layer, a tantalum layer, a chromium layer, a molybdenum layer, or a niobium layer.

4. The semiconductor device as claimed in claim 1, wherein the second region has an enclosed shape and an average value of widths of the second region is 0.10 μm or greater in plan view in a direction perpendicular to the upper surface of the first metal layer.

5. A semiconductor device comprising:
a substrate;
a first insulating layer provided over the substrate;
a first metal layer provided on the first insulating layer;
a second metal layer provided on the first metal layer; and
a second insulating layer covering the first metal layer and the second metal layer,
wherein an upper surface of the first metal layer has a first region that is in contact with the second metal layer, and a second region that is separated from the second metal layer,
wherein the second insulating layer is in direct contact with a side surface and the second region of the first metal layer and an upper surface and a side surface of the second metal layer,
wherein a width of the first metal layer is greater than or equal to a width of the second metal layer in a direction parallel to the substrate, and
wherein adhesion between the second insulating layer and the first metal layer is higher than adhesion between the second insulating layer and the second metal layer.

6. A semiconductor device comprising:
a substrate;
a first insulating layer provided over the substrate;
a first metal layer provided on the first insulating layer;
a second metal layer provided on the first metal layer; and
a second insulating layer covering the first metal layer and the second metal layer,
wherein an upper surface of the first metal layer has a first region that is in contact with the second metal layer, and a second region that is separated from the second metal layer,
wherein the second insulating layer is in direct contact with a side surface and the second region of the first metal layer and an upper surface and a side surface of the second metal layer,
wherein a width of the first metal layer is greater than or equal to a width of the second metal layer in a direction parallel to the substrate,
wherein the side surface of the second metal layer has a curved surface, and
wherein the curved surface is curved in a direction in which a center of an osculating circle is located inside the curved surface when viewed from the second metal layer.

7. A method of manufacturing a semiconductor device, comprising:
forming a first insulating layer on a substrate;
forming a first metal layer on the first insulating layer;
forming a seed layer on the first metal layer;
forming a plating layer on the seed layer to obtain a second metal layer including the seed layer and the plating layer;
etching the second metal layer such that an upper surface of the first metal layer has a first region that is in contact with the second metal layer and a second region that is separated from the second metal layer; and
forming a second insulating layer that is in direct contact with a side surface and the second region of the first metal layer and an upper surface and a side surface of the second metal layer.

8. The method of manufacturing the semiconductor device as claimed in claim 7, wherein the etching of the second metal layer is wet etching using an iodine-based etchant.

9. The method of manufacturing the semiconductor device as claimed in claim 7, wherein in the forming of the seed layer, a width of the formed seed layer is less than or equal to a width of the first metal layer in a direction parallel to the substrate.

10. A method of manufacturing a semiconductor device, comprising:
forming a first insulating layer on a substrate;
forming a third metal layer on the first insulating layer;
forming a second metal layer on the third metal layer;
forming an etching mask covering the second metal layer;
forming a first metal layer from the third metal layer by etching the third metal layer exposed from the etching mask, an upper surface of the first metal layer having a first region that is in contact with the second metal layer and a second region that is separated from the second metal layer;
removing the etching mask; and
forming a second insulating layer that is in direct contact with a side surface and the second region of the first metal layer and an upper surface and a side surface of the second metal layer.

11. The method of manufacturing a semiconductor device as claimed in claim 10, wherein, in the forming of the first metal layer from the third metal layer, a width of the formed first metal layer is greater than or equal to a width of the second metal layer in a direction parallel to the substrate.

* * * * *